(12) United States Patent
Asuri et al.

(10) Patent No.: US 11,609,253 B2
(45) Date of Patent: Mar. 21, 2023

(54) APPARATUS AND METHOD TO DETERMINE IMPEDANCE AND/OR ADMITTANCE IN A WIRELESS DEVICE

(71) Applicant: QUALCOMM Incorporated, San Diego, CA (US)

(72) Inventors: Bhushan Shanti Asuri, San Diego, CA (US); Chinmaya Mishra, San Diego, CA (US); Omar Essam El-Aassar, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 241 days.

(21) Appl. No.: 17/039,827

(22) Filed: Sep. 30, 2020

(65) Prior Publication Data
US 2022/0099719 A1    Mar. 31, 2022

(51) Int. Cl.
*G01R 27/02* (2006.01)
*G01R 25/04* (2006.01)

(52) U.S. Cl.
CPC ............. *G01R 27/02* (2013.01); *G01R 25/04* (2013.01)

(58) Field of Classification Search
CPC ........ G01R 27/00; G01R 27/02; G01R 25/00; G01R 25/04

USPC .......................................... 324/600, 649, 650
See application file for complete search history.

(56) References Cited

U.S. PATENT DOCUMENTS

| | | | |
|---|---|---|---|
| 2002/0180408 A1* | 12/2002 | McDaniel | H02J 3/1871 323/211 |
| 2006/0066403 A1 | 3/2006 | Grillo et al. | |
| 2008/0266021 A1 | 10/2008 | Van Bezooijen et al. | |
| 2010/0321086 A1 | 12/2010 | See et al. | |
| 2011/0187349 A1* | 8/2011 | Yamamoto | H03F 3/24 324/119 |
| 2013/0043846 A1* | 2/2013 | Murdock | H02M 1/4225 323/205 |
| 2016/0069940 A1 | 3/2016 | Chang | |
| 2016/0315719 A1* | 10/2016 | Jian | G01R 21/10 |

OTHER PUBLICATIONS

International Search Report and Written Opinion—PCT/US2021/048664—ISA/EPO—dated Nov. 23, 2021.

* cited by examiner

*Primary Examiner* — Hoai-An D. Nguyen
(74) *Attorney, Agent, or Firm* — Loza & Loza LLP

(57) ABSTRACT

In certain aspects, an apparatus includes a power detector coupled between a power amplifier and an antenna, and a voltage detector coupled between the power amplifier and the antenna. The apparatus also includes a phase shifter coupled to the power detector, and a load measurement circuit coupled to the power detector, the voltage detector, and the phase shifter.

35 Claims, 16 Drawing Sheets

APPARATUS AND METHOD TO DETERMINE IMPEDANCE AND/OR ADMITTANCE IN A WIRELESS DEVICE

BACKGROUND

Field

Aspects of the present disclosure relate generally to wireless communications, and, more particularly, to determining impedance and/or admittance in a wireless device.

Background

A wireless device may include a transmitter, a receiver, and an antenna for transmitting and receiving radio frequency (RF) signals. Characteristics of the transmitter and the receiver are sensitive to the impedance seen at the transmitter and the receiver. The impedance may be a function of the antenna impedance, environmental conditions (e.g., reflections), and module routing.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a power detector coupled between a power amplifier and an antenna, and a voltage detector coupled between the power amplifier and the antenna. The apparatus also includes a phase shifter coupled to the power detector, and a load measurement circuit coupled to the power detector, the voltage detector, and the phase shifter.

A second aspect relates to a method for measuring a load. The method includes measuring power delivered to the load to obtain a power measurement, measuring power delivered to the load with a phase shift to obtain a phase-shifted power measurement, and determining a phase angle of the load based on the power measurement, the phase-shifted power measurement, and the phase shift.

A third aspect relates to an apparatus for measuring a load. The apparatus includes means for measuring power delivered to the load to obtain a power measurement, means for measuring power delivered to the load with a phase shift to obtain a phase-shifted power measurement, and means for determining a phase angle of the load based on the power measurement, the phase-shifted power measurement, and the phase shift.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
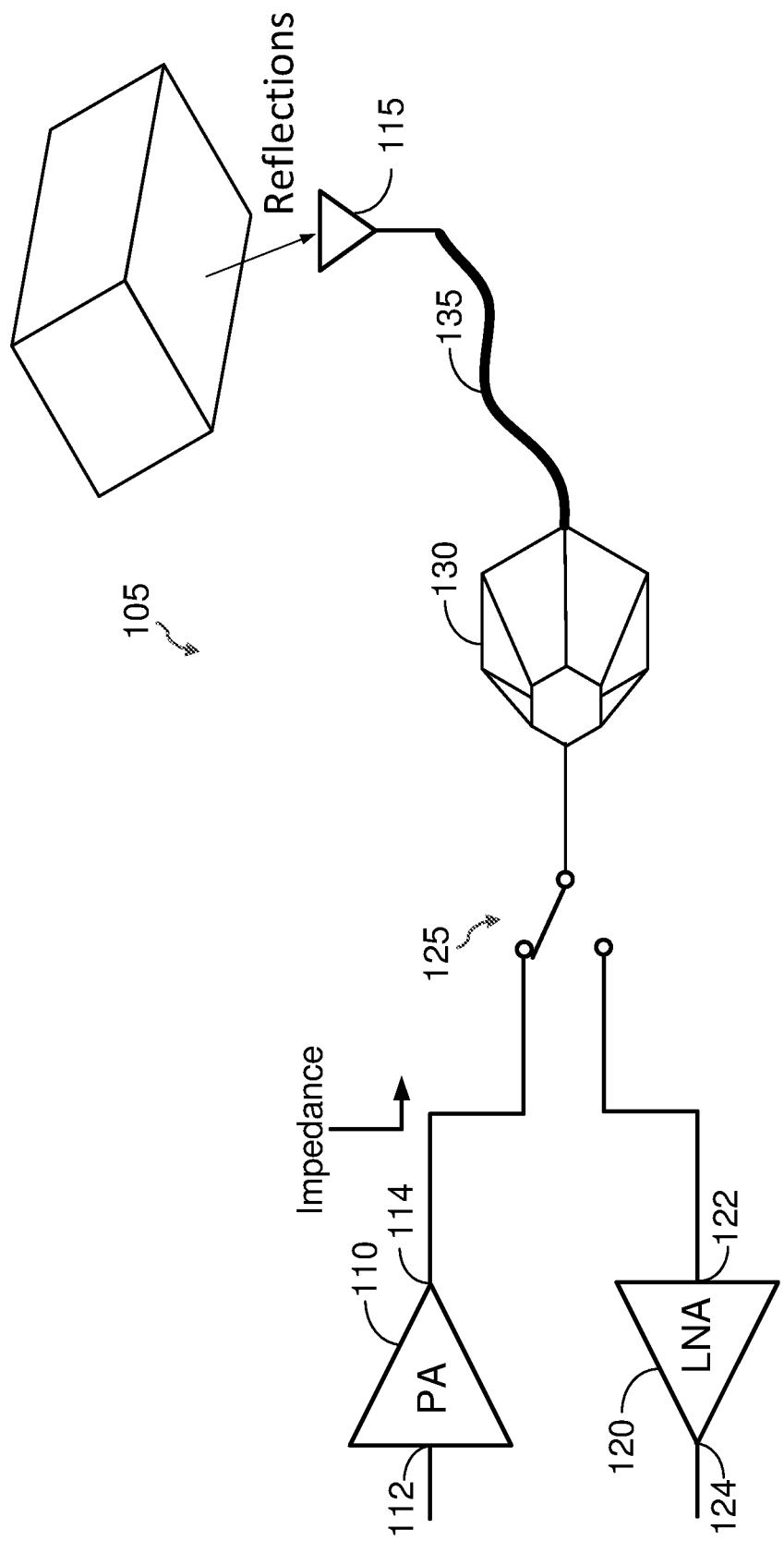
FIG. 1 shows an example of a wireless device including a transmitter, a receiver, and an antenna according to certain aspects of the present disclosure.

FIG. 1 shows an example of a wireless device 105 including a power amplifier (PA) 110, a low-noise amplifier (LNA) 120, a switch 125, a bump 130, and an antenna 115. The PA 110 is part of a transmitter of the wireless device 105 and the LNA 120 is part of a receiver of the wireless device 105. The switch 125 is coupled between the bump 130 and the output 114 of the PA 110. The switch 125 is also coupled between the bump 130 and the input 122 of the LNA 120. As discussed further below, the switch 125 is configured to selectively couple the PA 110 or the LNA 120 to the bump 130. In certain aspects, the PA 110, the LNA 120, and the switch 125 are integrated on a chip, and the bump 130 (e.g., solder bump) couples the chip to the antenna 115 via a route 135 (e.g., a metal trace on a printed circuit board (PCB)).

In a transmit mode, the switch 125 couples the output 114 of the PA 110 to the antenna 115. In this mode, the PA 110 receives an RF signal at the input 112 of the PA 110 (e.g., from a frequency up-converter), amplifies the received RF signal, and outputs the amplified RF signal at the output 114 of the PA 110 for transmission via the antenna 115. In a receive mode, the switch 125 couples the antenna 115 to the input 122 of the LNA 120. In this mode, the LNA 120 receives an RF signal at the input 122 of the LNA 120 from the antenna 115, amplifies the received RF signal, and outputs the amplified RF signal at the output 124 of the LNA 120 (e.g., to a frequency down-converter).

Characteristics of the transmitter (which includes the PA 110) and the receiver (which includes the LNA 120) are sensitive to the impedance seen at the transmitter and the receiver. The impedance may be a function of the impedance of the antenna 115, environmental conditions (e.g., reflections), the impedance of the bump 130, and the route 135 between the antenna 115 and the bump 130. Typically, the impedance is a complex impedance including a resistive component and a reactive component.

Knowledge of the impedance can be used to improve the performance of the transmitter and/or the receiver. For example, the transmitter may include a tunable impedance matching network (not shown in FIG. 1) between the output 114 of the PA 110 and the switch 125. In this example, the impedance matching network may be tuned based on knowledge of the impedance to provide a desired internal impedance at the output of the PA 110. In another example, knowledge of the impedance may be used to verify that an antenna module including the antenna 115 meets an impedance specification.

Determining the impedance seen at the transmitter and the receiver is challenging. Currently, the impedance is measured using test structures and a system of probes. A drawback of this approach is that it requires an external system to measure the impedance and is not available in the field to determine, for example, changes in the impedance due to changes in environmental conditions (e.g., reflections). Accordingly, a built-in circuit on the wireless device capable of measuring the impedance is desirable. It is also desirable that the built-in circuit does not interfere with the operations of the transmitter and the receiver.

Figure 2:
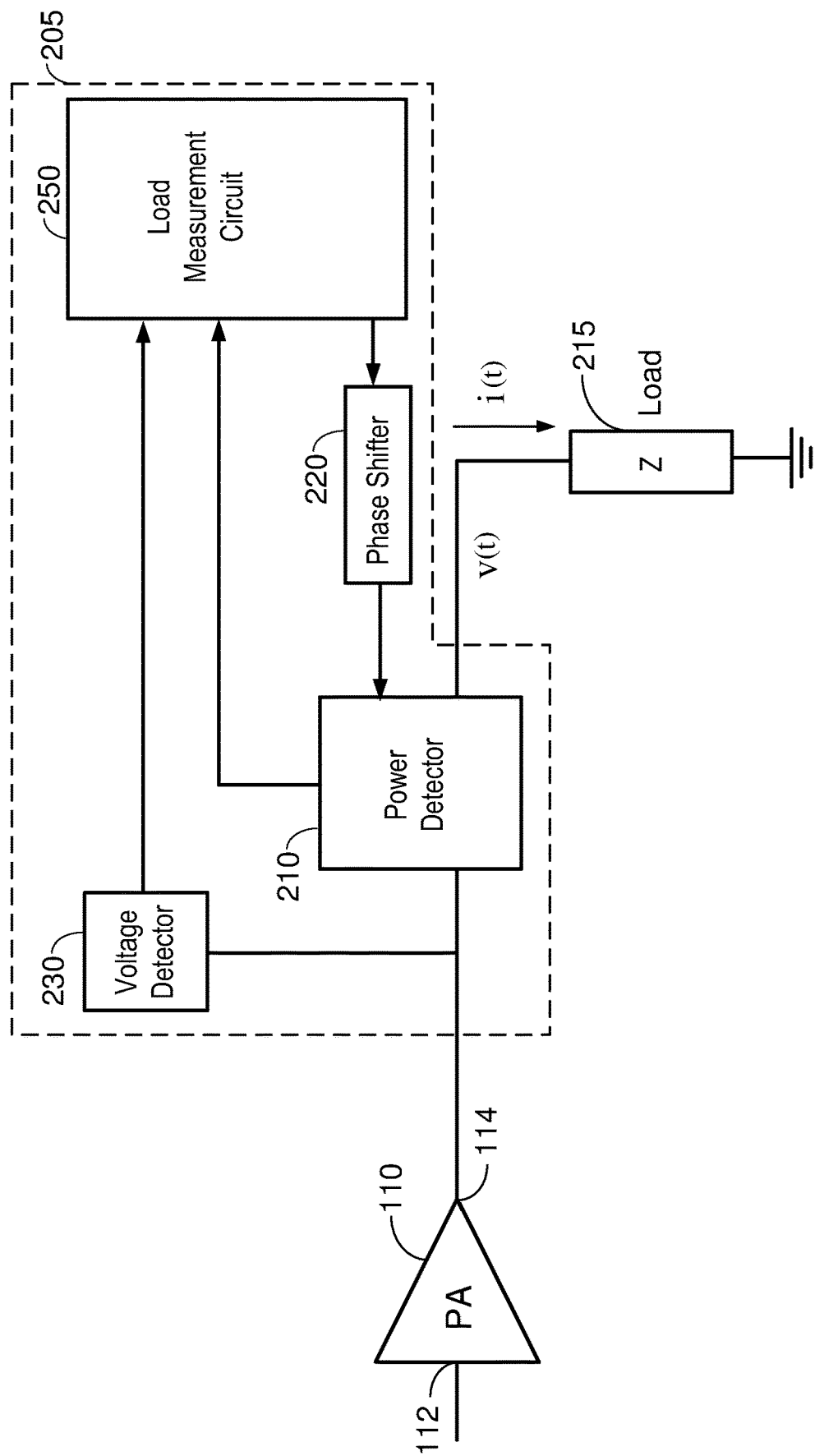
FIG. 2 shows an example of a circuit for determining an impedance and/or admittance according to certain aspects of the present disclosure.

FIG. 2 shows an example of a circuit 205 for determining an impedance and/or an admittance of a load 215 according to aspects of the present disclosure. The circuit 205 may be integrated with the PA 110. The circuit 205 includes a power detector 210, a phase shifter 220, a voltage detector 230, and a load measurement circuit 250. The power detector 210 is coupled between the PA 110 and the load 215. The load 215 may include the loads of the antenna 115, the route 135, and the bump 130 shown in FIG. 1, and may be sensitive to reflections. As discussed further below, the power detector 210 is configured to measure the average power delivered to the load 215 and output an average power measurement to the load measurement circuit 250.

The phase shifter 220 is coupled to the power detector 210. The phase shifter 220 is configured to shift the phase of an average power measurement of the power detector 210 by a known phase shift, as discussed further below. The phase shifter 220 is controlled by the load measurement circuit 250.

The voltage detector 230 is coupled between the output 114 of the PA 110 and the power detector 210. The voltage detector 230 is configured to measure the voltage at the power detector 210 and output a voltage measurement to the load measurement circuit 250.

Exemplary operations for measuring the impedance and/or the admittance of the load 215 will now be discussed according to certain aspects.

During a first time period, the power detector 210 measures the average power delivered to the load 215 without a phase shift from the phase shifter 220. In this case, the load measurement circuit 250 may disable the phase shifter 220 during the first time period so that the phase shifter 220 does not shift the phase of the average power measurement of the power detector 210 during the first time period, as discussed further below.

In certain aspects, the power detector 210 measures the instantaneous power delivered to the load 215, which is given by the product of the voltage and the current of the load 215 as follows:

$$p(t) = v(t) \cdot i(t) \tag{1}$$

where p(t) is the power delivered to the load 215, v(t) is the voltage across the load 215, and i(t) is the current through the load 215. In one example, the voltage v(t) across the load 215 is a sinusoidal signal given by:

$$v(t) = V \cos(\omega_{RF} t) \tag{2}$$

where V is the amplitude of the voltage v(t) and $\omega_{RF}$ is the angular frequency of the voltage v(t). For a wireless device operating in the millimeter wave (mmWave) band, the angular frequency can be in the GHz range. In this example, the load current i(t) is given by:

$$i(t) = I \cos(\omega_{RF} t + \theta) \tag{3}$$

where I is the amplitude of the current i(t) and θ is the phase angle between the voltage v(t) and the current i(t). The phase angle θ comes from the fact that the impedance of the load 215 is complex. For the case of a purely resistive load, the phase angle θ is zero. In this example, the instantaneous power is given by plugging the expressions for the voltage v(t) and the current i(t) given in equations (2) and (3), respectively, into equation (1), which results in the following:

$$p(t) = \frac{IV}{2}(\cos(\theta) + \cos(2\omega_{RF} t + \theta)). \tag{4}$$

As shown in equation (4), the instantaneous power includes a first term and a second term, in which the first term is given by $$\frac{IV}{2}\cos(\theta)$$

and the second term is a second harmonic term given by $$\frac{IV}{2}\cos(2\omega_{RF} t + \theta).$$

The first term provides the average power delivered to the load 215. Thus, the power detector 210 may measure the average power delivered to the load 215 by filtering out the second harmonic term in equation (4) using low pass filtering, resulting in the following average power:

$$P_L = \frac{IV}{2}\cos(\theta) \qquad (5)$$

where $P_L$ is the average power. The power detector 210 outputs an average power measurement proportional to the average power $P_L$ to the load measurement circuit 250. In this example, the power detector 210 measures power delivered to the load 215 during the first time period to obtain the average power measurement.

During a second time period, the power detector 210 measures the average power delivered to the load 215 with a phase shift from the phase shifter 220. In this case, the load measurement circuit 250 may enable the phase shifter 220 during the second time period to shift the phase of the average power measurement of the power detector 210 during the second time period. The average power measurement with the phase shift is proportional to the following:

$$P_x = \frac{IV}{2}\cos(\theta + \gamma) \qquad (6)$$

where $P_x$ is the average power with the phase shift and $\gamma$ is the phase shift. The phase shift $\gamma$ is a known phase shift provided by the phase shifter 220. Thus, the phase shifter 220 adds the phase shift $\gamma$ to the phase angle $\theta$ in the average power measurement. The power detector 210 outputs the average power measurement with the phase shift to the load measurement circuit 250. Thus, in this example, the power detector 210 measures power delivered to the load 215 with the phase shifter 220 enabled during the second time period to obtain the power measurement with the phase shift (i.e., phase-shifted average power measurement).

Thus, the load measurement circuit 250 receives the average power measurement without the phase shift and the average power measurement with the phase shift from the power detector 210. Using the average power measurement without the phase shift, the average power measurement with the phase shift, and knowledge of the phase shift $\gamma$, the load measurement circuit 250 is able to determine the phase angle $\theta$ of the load 215, as discussed further below.

As used herein, the term "proportional" covers the possibility of a proportionality factor of less than one, equal to one, or greater than one. Thus, the average power measurement without the phase shift output from the power detector 210 may be proportional to the average power $P_L$ delivered to the load 215 by a proportionality factor of less than one, greater than one, or equal to one. Similarly, the average power measurement with the phase shift output from the power detector 210 may be proportional to the average power $P_x$ with the phase shift by a proportionality factor of less than one, greater than one, or equal to one.

Taking the ratio of the average power measurement with the phase shift over the average power measurement without the phase shift results in the following:

$$\frac{P_x}{P_L} = \frac{\cos(\theta + \gamma)}{\cos(\theta)} = \cos(\gamma) - \tan(\theta)\sin(\gamma). \qquad (7)$$

Solving for the phase angle $\theta$ in equation (7) results in the following:

$$\theta = \tan^{-1}\left(\frac{\cos\gamma - \frac{P_x}{P_L}}{\sin\gamma}\right). \qquad (8)$$

Since the average power measurement without the phase shift, the average power measurement with the phase shift, and the phase shift $\gamma$ are known, the load measurement circuit 250 is able to compute the phase angle $\theta$ of the load 215 based on equation (8). In other words, the load measurement circuit 250 is able to compute the phase angle $\theta$ between the load voltage v(t) and the load current i(t). Note that the ratio of the average power measurement with the phase shift over the average power measurement without the phase shift is approximately equal to the power ratio $$\frac{P_x}{P_L}.$$

This assumes that the proportionality factor for both power measurements is the same so that the proportionality factor cancels out in the ratio.

The voltage detector 230 measures the amplitude of the voltage V at the power detector 210 and outputs a voltage measurement proportional to the amplitude of the voltage V to the load measurement circuit 250. The load measurement circuit 250 may then determine the magnitude of the load admittance based on the following:

$$P_L = \frac{|V|^2}{2}|Y|\cos(\theta) \qquad (9)$$

where |Y| is the magnitude of the admittance of the load 215. Equation (9) can be derived from equation (5) and the fact that load current is equal to load voltage multiplied by load admittance. Since the phase angle $\theta$ is known from the previous computation and measurements of the average power $P_L$ and the magnitude of the voltage V are provided by the power detector 210 and the voltage detector 230, respectively, the load measurement circuit 250 is able to compute a load admittance value that is proportional to the magnitude of the load admittance based on equation (9). The load measurement circuit 250 may determine a load impedance value that is proportional to the magnitude of the load impedance by computing the inverse of the load admittance value.

As discussed above, the term "proportional" covers the possibility of a proportionality factor of less than one, equal to one, or greater than one. Thus, the load admittance value computed by the load measurement circuit 250 may be proportional to the magnitude of the load admittance by a proportionality factor of less than one, greater than one, or equal to one. The load admittance value conveys information on the magnitude of the load admittance with a larger admittance value being indicative of a larger magnitude of the load admittance. Similarly, the load impedance value computed by the load measurement circuit 250 may be proportional to the magnitude of the load impedance by a proportionality factor of less than one, greater than one, or equal to one. The load impedance value conveys information on the magnitude of the load impedance with a larger impedance value being indicative of a larger magnitude of the load impedance.

It is to be appreciated that, in some implementations, the load measurement circuit 250 may compute the load admittance value without computing the load impedance value since load admittance provides similar information as load impedance (i.e., low load admittance is indicative of high load impedance, and vice versa). Thus, the load measurement circuit 250 may compute a load admittance value, a load impedance value, or both.

In equation (9) given above, the load admittance value is computed based on the square of the magnitude of the voltage V (i.e., $|V|^2$). In one example, the voltage detector 230 measures the amplitude of the voltage V, and outputs a voltage measurement proportional to the amplitude of the voltage V to the load measurement circuit 250. In this example, the load measurement circuit 250 may compute the square of the magnitude of the voltage by squaring the voltage measurement from the voltage detector 230. In another example, the voltage detector 230 measures the square of the amplitude of the voltage V, and outputs a voltage measurement proportional to the square of the amplitude of the voltage V to the load measurement circuit 250. In this example, the load measurement circuit 250 does not need to compute the square of the magnitude of the voltage since a measurement of the square of the magnitude of the voltage is already provided by the voltage detector 230. In this example, the voltage squaring operation is performed at the voltage detector 230.

Thus, the circuit 205 measures the admittance and/or impedance of the load 215, in which the measured impedance may include the computed phase angle and/or load impedance value, and the measured admittance may include the computed phase angle and/or load admittance value. The measured admittance and/or impedance can be used to improve the performance of the transmitter and/or the receiver.

For example, the transmitter may include a tunable impedance matching network (not shown in FIG. 1) between the output 114 of the PA 110 and the load 215, in which the impedance matching network is configured to transform the impedance of the load into a desired internal impedance at the output 114 of the PA 110. In this example, the impedance transformation of the impedance matching network may be tuned based on the measured impedance of the load 215 to provide the desired impedance at the output 114 of the PA 110. In some implementations, the measured admittance may be used to tune the impedance matching network by converting the desired impedance into an equivalent desired admittance, and tuning the impedance matching network based on the measured admittance to achieve the desired admittance at the output 114 of the PA 110.

In another example, the measured impedance may be used to protect the PA 110 from excessive voltage swings at the output 114. For example, a large increase in voltage swing may occur at the output 114 of the PA 110 due to a large increase in the load impedance. The large increase in the load impedance may be due to an open circuit or another fault. In this example, the large increase in the load impedance may be detected by detecting a large increase in the measured impedance (e.g., the impedance value exceeds a threshold). When the large increase in the load impedance is detected, the gain of the PA 110 may be decreased to prevent an excessively large voltage swing at the output 114 of the PA 110, which can potentially damage the PA 110. A large increase in the load impedance may also be detected by detecting a large increase in the voltage measurement from the voltage detector 230 accompanied by a small average power measurement from the power detector 210, which is indicative of high impedance. In some implementations, the large increase in the load impedance may be detected by detecting a large decrease in the measured admittance (e.g., the admittance value falls below a threshold).

In another example, the measured impedance may be used to verify that an antenna module including the antenna 115 meets an impedance specification. In this example, failure to meet the impedance specification may indicate a problem with the route 135 or the antenna 115. The measured admittance may also be used to verify compliance with the impedance specification. For example, the impedance specification may be given as an equivalent admittance specification. In this example, the measured admittance may be compared with the admittance specification to determine whether the antenna module meets the admittance specification and hence the impedance specification.

Figure 3:
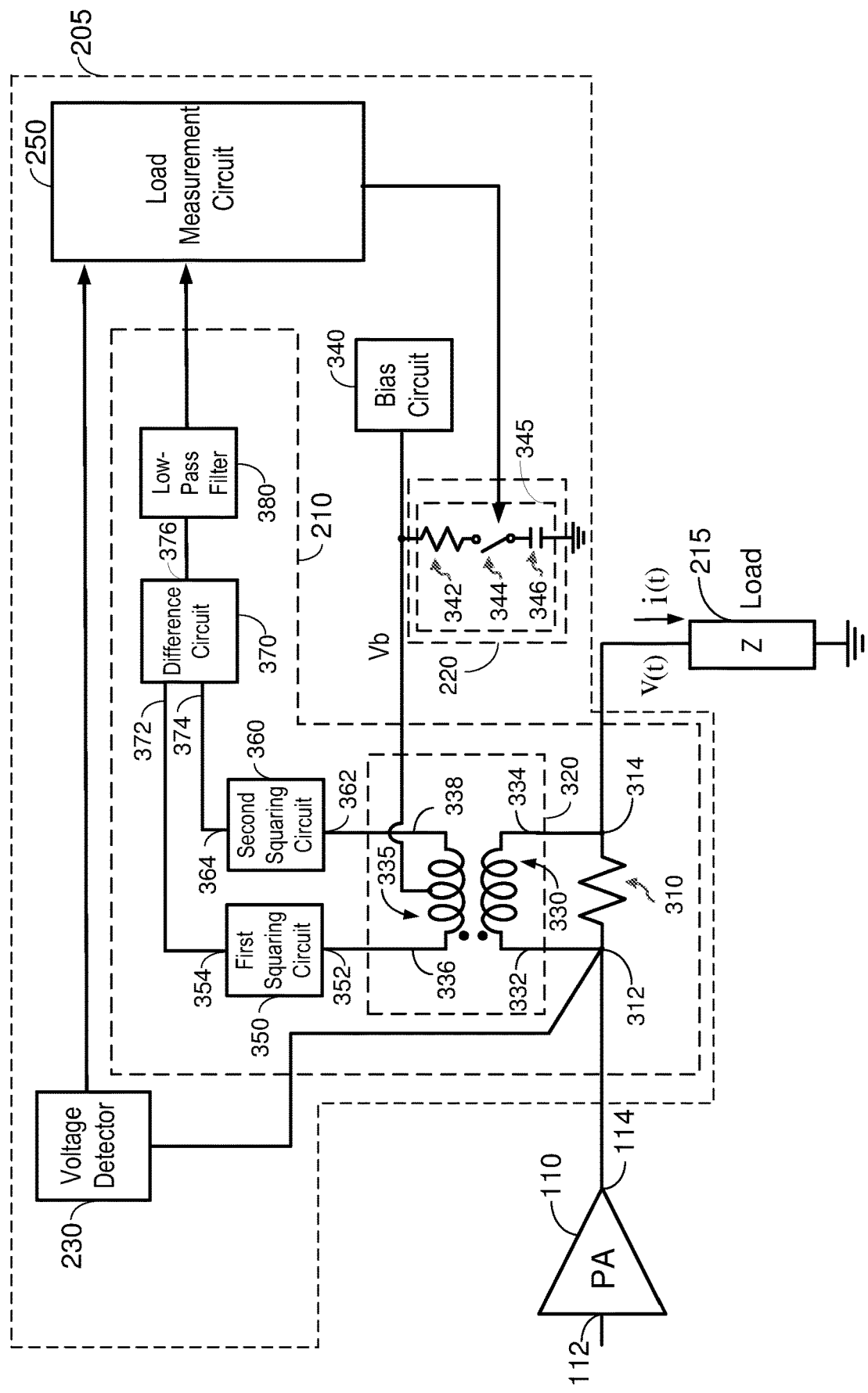
FIG. 3 shows an exemplary implementation of a power detector and a phase shifter according to certain aspects of the present disclosure.

FIG. 3 shows an exemplary implementation of the power detector 210 and the phase shifter 220 according to certain aspects. In this example, the power detector 210 includes a resistive element 310 coupled between the PA 110 and the load 215. The resistive element 310 has a first terminal 312 coupled to the PA 110 and a second terminal 314 coupled to the load 215.

The resistive element 310 is coupled in series with the load 215 so that the current flowing through the load 215 also flows through the resistive element 310. In certain aspects, the resistive element 310 has a very low resistance (e.g., a few ohms) so that the power loss from the resistive element 310 is very small. The resistive element 310 may be implemented with a low-resistance resistor (e.g., a metal line resistor). The very small power loss from the resistive element 310 allows the circuit 205 to measure the admittance and/or impedance of the load 215 while having very little impact on the power delivered to the load from the PA 110.

Figure 11:
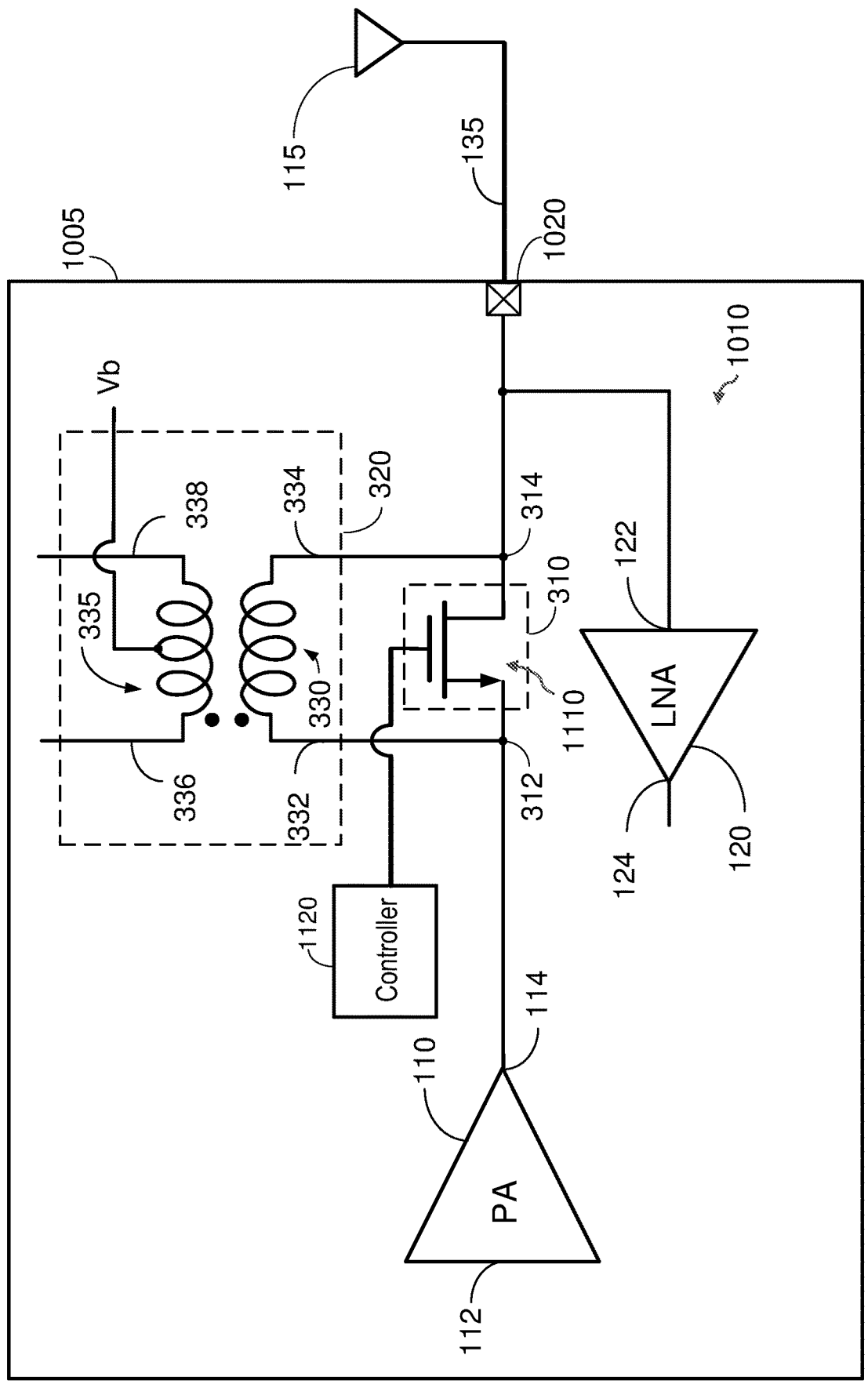
FIG. 11 shows an example of a resistive element for measuring power where the resistive element is implemented with a switch according to certain aspects of the present disclosure.

In some implementations, the resistive element 310 may be implemented with a switch (e.g., switch 125), in which the on resistance of the switch provides the resistance of the resistive element 310. An advantage of using the switch for the resistive element 310 is that the switch may already be present in the transmit path to switch between the transmit mode and the receive mode. In this case, using the existing switch as the resistive element 310 may allow the power detector 210 to measure power delivered to the load 215 without incurring additional power loss in the transmit path. An example in which the resistive element 310 is implemented with a switch is illustrated in FIG. 11 discussed below.

In this example, the power detector 210 also includes a transformer 320, a first squaring circuit 350, a second squaring circuit 360, a difference circuit 370, and a low-pass filter 380. The transformer 320 includes a first inductor 330 (e.g., primary inductor) and a second inductor 335 (e.g., secondary inductor), in which the second inductor 335 is magnetically coupled with the first inductor 330.

In this example, the first inductor 330 of the transformer 320 is coupled in parallel with the resistive element 310. More particularly, a first terminal 332 of the first inductor 330 is coupled to the first terminal 312 of the resistive element 310, and a second terminal 334 of the first inductor 330 is coupled to the second terminal 314 of the resistive element 310.

The second inductor 335 is coupled between the inputs of the squaring circuits 350 and 360. More particularly, a first terminal 336 of the second inductor 335 is coupled to the input 352 of the first squaring circuit 350, and a second terminal 338 of the second inductor 335 is coupled to the input 362 of the second squaring circuit 360.

The first squaring circuit 350 is configured to generate a first square signal at the output 354 of the first squaring circuit 350 that is proportional to the square of the voltage at the input 352 of the first squaring circuit 350. The second squaring circuit 360 is configured to generate a second square signal at the output 364 of the second squaring circuit 360 that is proportional to the square of the voltage at the input 362 of the second squaring circuit 360.

The difference circuit 370 has a first input 372 coupled to the output 354 of the first squaring circuit 350, a second input 374 coupled to the output 364 of the second squaring circuit 360, and an output 376. The difference circuit 370 generates a difference signal that is proportional to the difference between the first square signal from the first squaring circuit 350 and the second square signal from the second squaring circuit 360.

The low-pass filter 380 is coupled between the output 376 of the difference circuit 370 and the load measurement circuit 250. The low-pass filter 380 is configured to low-pass filter the difference signal from the difference circuit 370 to generate an average power measurement for the load 215, which is output to the load measurement circuit 250. In certain aspects, the load measurement circuit 250 may include an analog-to-digital converter (ADC) configured to convert the difference signal into a digital signal. In these aspects, the load measurement circuit 250 may compute the phase angle in the digital domain, and compute the admittance value and/or impedance value in the digital domain.

As discussed above, the first squaring circuit 350, the second squaring circuit 360, the difference circuit 370, and the low-pass filter 380 generate an average power measurement for the load 215. This may be demonstrated by the discussion below according to certain aspects.

Assuming the current through the resistive element 310 is equal to or sufficiently close to the current through the load 215 and assuming the voltage at the second terminal 314 of the resistive element 310 is equal to the voltage across the load 215, the current through the load 215 may be given by:

$$i(t) = \frac{v_A(t) - v(t)}{R} \quad (10)$$

where R is the resistance of the resistive element 310, $v_A(t)$ is the voltage at the first terminal 312 of the resistive element, and v(t) is the voltage at the second terminal 314 of the resistive element 310 (which is assumed to be equal to the voltage across the load 215). Equation (10) also gives the current through the resistive element 310 since the resistive element 310 is in series with the load 215. In this example, the voltage at the first terminal 312 of the resistive element 310 is related to the current through the load 215 and the voltage across the load 215 by the following:

$$v_A(t) = i(t) \cdot R + v(t) \quad (11)$$

where $i(t) \cdot R$ is the voltage drop across the resistive element 310 from the current passing through the resistive element 310. The square of the voltage at the first terminal 312 of the resistive element 310 is given by:

$$v_A^2(t) = i^2(t) \cdot R^2 + 2v(t)i(t)R + v^2(t) \quad (12)$$

which is obtained by squaring equation (11).

Assuming the voltage at the second terminal 314 of the resistive element 310 is equal to the voltage across the load 215, the difference between the square of the voltage at the first terminal 312 and the square of the voltage at the second terminal 314 is given by:

$$v_A^2(t) - v^2(t) = i^2(t) \cdot R^2 + 2v(t)i(t)R \quad (13).$$

Since the resistance of the resistive element 310 is very low, the term with the resistance squared in equation (13) is very small and can therefore be neglected resulting in the following:

$$v_A^2 - v_B^2(t) = 2v(t)i(t)R \quad (14).$$

As shown in equation (14), the difference between the square of the voltage at the first terminal 312 and the square of the voltage at the second terminal 314 is proportional to the power delivered to the load 215 by a proportionality factor of 2R. Thus, the difference signal output by the difference circuit 370 (which is proportional to the difference between the first square signal from the first squaring circuit 350 and the second square signal from the second squaring circuit 360) is proportional to the power delivered to the load 215.

The low-pass filter 380 may then filter out the second harmonic component in the difference signal to generate an average power measurement that is proportional to the average power delivered to the load 215. As discussed above with reference to equation (4), average power may be obtained by filtering out the second harmonic component (i.e., second harmonic term in equation (4)) in the power delivered to the load 215. In this example, the low-pass filter 380 has a cut-off frequency below the second harmonic frequency in order to filter out the second harmonic component. For examples in which the transmitter is used for transmissions in the millimeter wave (mmWave) band, the second harmonic frequency can be in the GHz range.

It is to be appreciated that the present disclosure is not limited to performing low-pass filtering on the difference signal to generate the average power measurement. In other implementations, the low-pass filtering may be performed on the first square signal and the second square signal before the difference circuit 370, as discussed further below with reference to FIG. 5.

In the example shown in FIG. 3, the phase shifter 220 is coupled to a center tap of the second inductor 335 (e.g., secondary inductor) of the transformer 320. In this example, the phase shifter 220 includes a switchable RC circuit 345 coupled between the center tap of the second inductor 335 and ground. The switchable RC circuit 345 includes a resistor 342, a switch 344, and a capacitor 346 coupled in series between the center tap of the second inductor 335 and ground. In this example, the center tap of the second inductor is biased by a bias circuit 340. The switch 344 may be implemented with one or more transistors, a transmission gate, or another type of switch.

In operation, the switch 344 is controlled by the load measurement circuit 250 to selectively shift the average power measurement of the power detector 210. To measure the average power without the phase shift, the load measurement circuit 250 opens the switch 344, which disables the phase shifter 220. To measure the average power with the phase shift, the load measurement circuit 250 closes the switch 344, which enables the phase shifter 220. The closing of the switch 344 causes the resistor 342 and the capacitor 346 to form a series RC circuit coupled to the center tap of the second inductor 335. The series RC circuit shifts the phase of the average power measurement by a phase shift dependent on the resistance of the resistor 342 and the capacitance of the capacitor 346. Since the resistance of the resistor 342 and the capacitance of the capacitor 346 are known, the phase shift induced by the series RC circuit is known.

Although the switchable RC circuit 345 is coupled between the center tap of the second inductor 335 and ground in the example shown in FIG. 3, it is to be appreciated that the present disclosure is not limited to this example. In another example, the switchable RC circuit 345 may be coupled between the first terminal 336 and the second terminal 338 of the second inductor 335.

Figure 4:
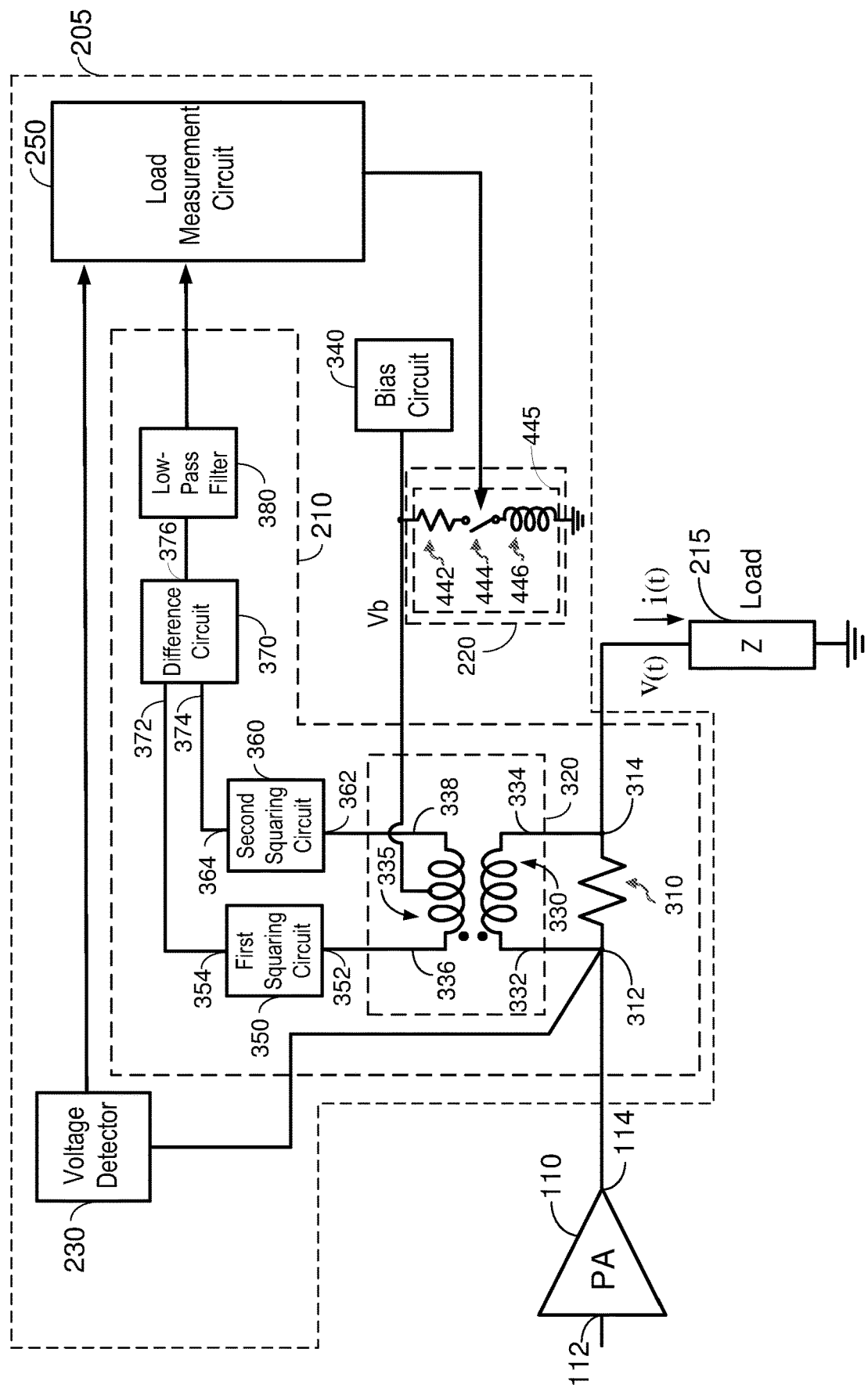
FIG. 4 shows another exemplary implementation of a phase shifter according to certain aspects of the present disclosure.

It is to be appreciated that the phase shifter 220 is not limited to the exemplary switchable RC circuit 345 shown in FIG. 3. In this regard, FIG. 4 shows another exemplary implementation of the phase shifter 220 in which the phase shifter 220 includes a switchable RL circuit 445 coupled between the center tap of the second inductor 335 and ground. The switchable RL circuit 445 includes a resistor 442, a switch 444, and an inductor 446 coupled in series between the center tap of the second inductor 335 and ground. The switch 444 may be implemented with one or more transistors, a transmission gate, or another type of switch.

In operation, the switch 444 is controlled by the load measurement circuit 250 to selectively shift the average power measurement of the power detector 210. To measure the average power without the phase shift, the load measurement circuit 250 opens the switch 444, which disables the phase shifter 220. To measure the average power with the phase shift, the load measurement circuit 250 closes the switch 444, which enables the phase shifter 220. The closing of the switch 444 causes the resistor 442 and the inductor 446 to form a series RL circuit coupled to the center tap of the second inductor 335. The series RL circuit shifts the phase of the average power measurement by a phase shift dependent on the resistance of the resistor 442 and the inductance of the inductor 446. Since the resistance of the resistor 442 and the inductance of the inductor 446 are known, the phase shift induced by the series RL circuit is known.

Although the switchable RL circuit 445 is coupled between the center tap of the second inductor 335 and ground in the example shown in FIG. 4, it is to be appreciated that the present disclosure is not limited to this example. In another example, the switchable RL circuit 445 may be coupled between the first terminal 336 and the second terminal 338 of the second inductor 335.

It is to be appreciated that the phase shifter 220 is not limited to the examples given above. The phase shifter 220 may be implemented with other combinations of one or more resistive elements and one or more reactive elements (e.g., capacitor and/or inductor) that induce a phase shift in the average power measurement of the power detector 210 by a known phase shift. One or more switches may be coupled to the one or more resistive elements and the one or more reactive elements to selectively enable and disable the phase shifter 220 by controlling the one or more switches.

Figure 5:
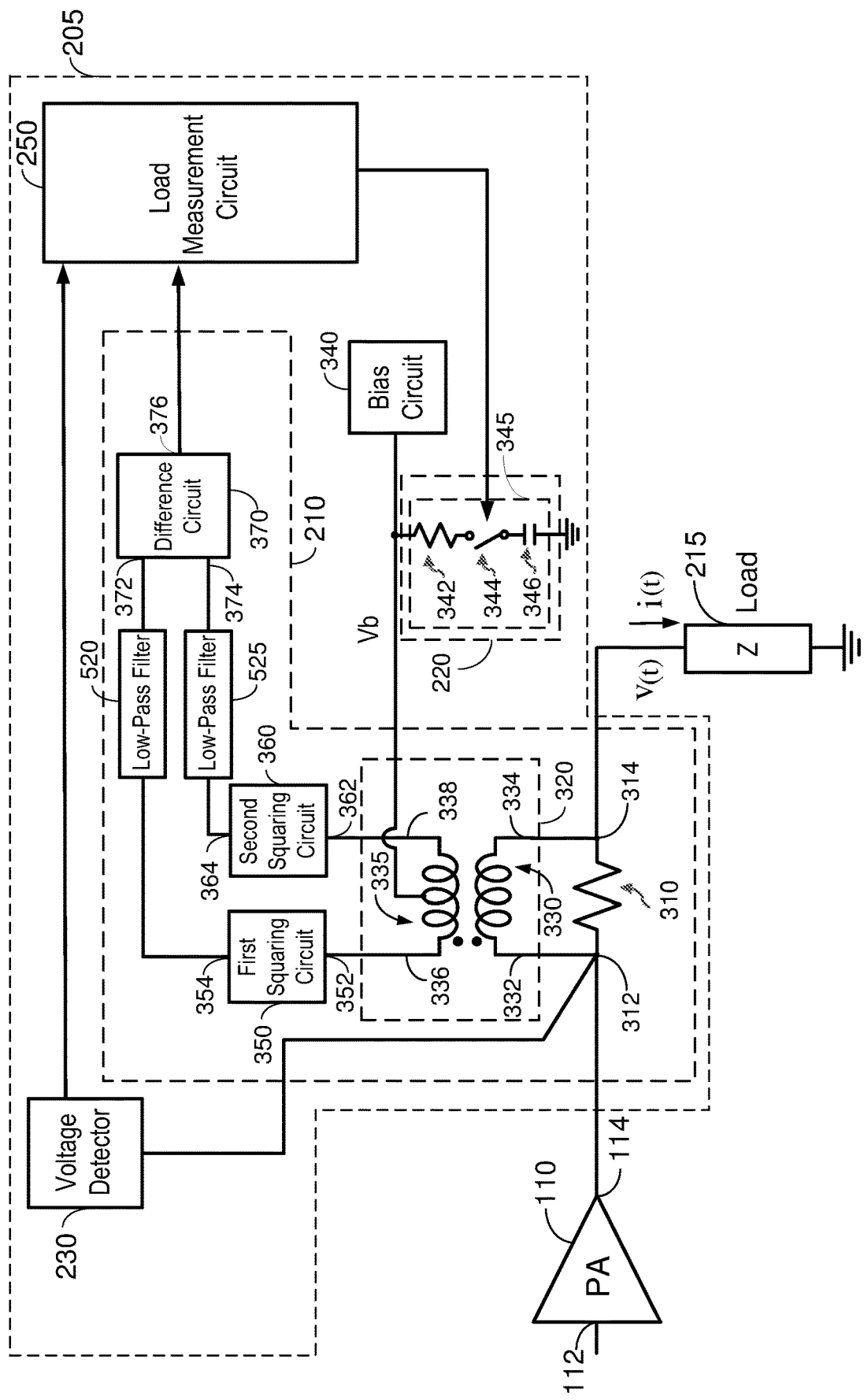
FIG. 5 shows another exemplary implementation of a power detector according to certain aspects of the present disclosure.

As discussed above, low-pass filtering may be performed before the difference circuit 370. In this regard, FIG. 5 shows an example in which the power detector 210 includes a first low-pass filter 520 coupled between the output 354 of the first squaring circuit 350 and the first input 372 of the difference circuit 370, and a second low-pass filter 525 coupled between the output 364 of the second squaring circuit 360 and the second input 374 of the difference circuit 370.

In operation, the first low-pass filter 520 filters out the second harmonic component generated by the squaring operation of the first squaring circuit 350 from the first square signal and outputs the filtered first square signal to the first input 372 of the difference circuit 370. The second low-pass filter 525 filters out the second harmonic component generated by the squaring operation of the second squaring circuit 360 from the second square signal and outputs the filtered second square signal to the second input 374 of the difference circuit 370.

The difference circuit 370 then generates a difference signal that is proportional to the difference between the filtered first square signal and the filtered second square signal. Since the second harmonic components in the first square signal and the second square signal are filtered out by the first low-pass filter 520 and the second low-pass filter 525, respectively, before being input to the difference circuit 370, the difference signal output from the difference circuit 370 does not include the second harmonic component discussed above, and is therefore proportional to the average power delivered to the load 215. Thus, in this example, the difference signal output from the difference circuit 370 provides an average power measurement for the load 215.

Figure 6:
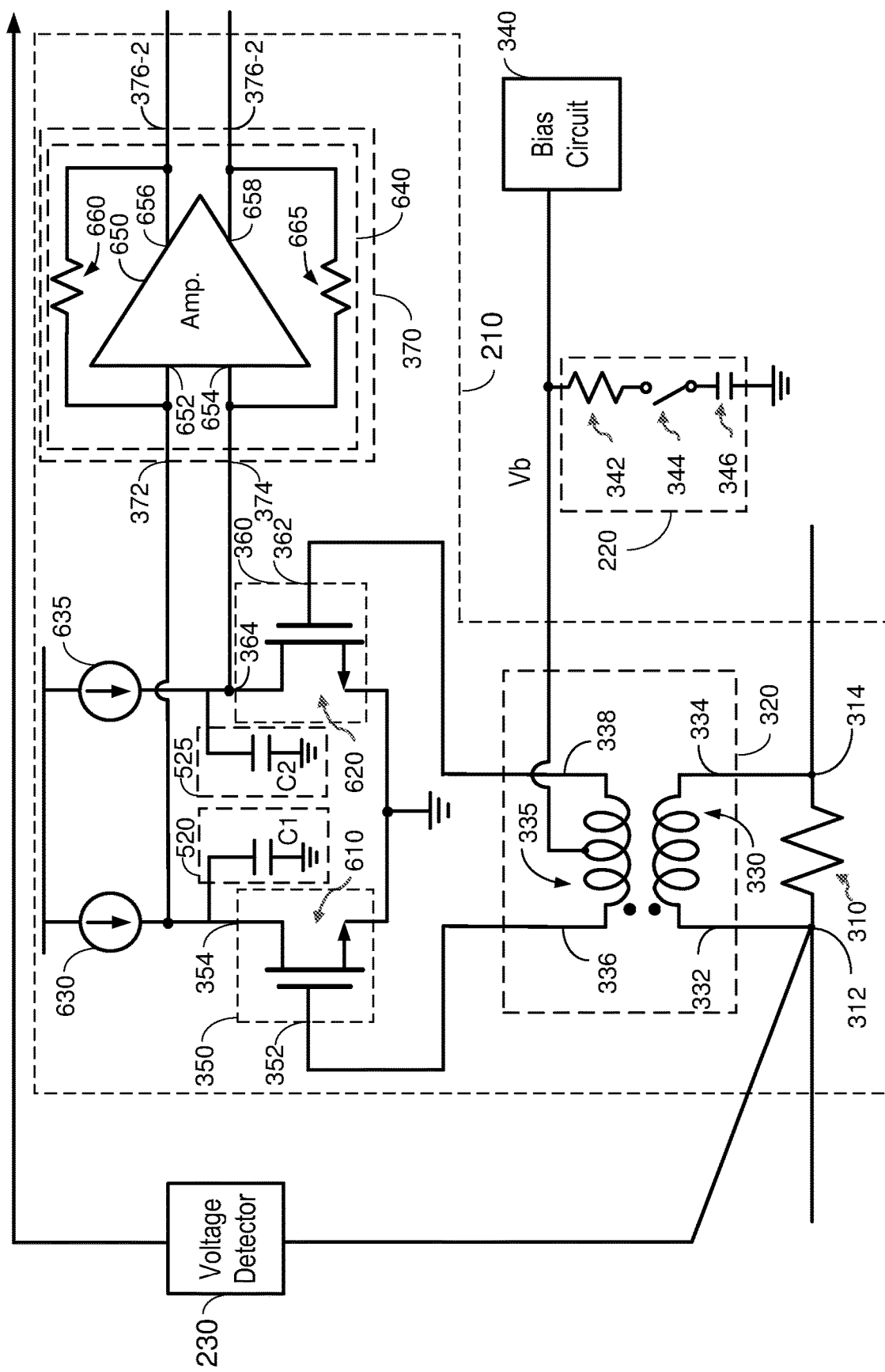
FIG. 6 shows an exemplary implementation of a first squaring circuit, a second squaring circuit, and a difference circuit according to certain aspects of the present disclosure.

FIG. 6 shows an exemplary implementation of the first squaring circuit 350, the second squaring circuit 360, the first low-pass filter 520, the second low-pass filter 525, and the difference circuit 370 according to certain aspects. Note that the load measurement circuit 250, the PA 110, and the load 215 are not shown in FIG. 6 for ease of illustration.

In the example shown in FIG. 6, the first squaring circuit 350 includes a first transistor 610, in which the gate of the first transistor 610 is coupled to the first terminal 336 of the second inductor 335 and the source of the first transistor 610 is coupled to ground. In this example, the power detector 210 includes a first current source 630 coupled between a supply rail and the drain of the first transistor 610 to provide the first transistor 610 with bias current. The bias circuit 340 biases the gate of the first transistor 610 with a bias voltage (labeled "Vb") via the second inductor 335, which acts as a direct current (DC) short. In this example, the input 352 of the first squaring circuit 350 is located at the gate of the first transistor 610, and the output 354 of the first squaring circuit 350 is located at the drain of the first transistor 610.

In operation, the first transistor 610 generates a drain current that is proportional to the square of the voltage at the gate of the first transistor 610 based on a square law relationship between the drain current of the first transistor 610 and the gate voltage of the first transistor 610. Thus, in this example, the first square signal of the first squaring circuit 350 is provided by the drain current of the first transistor 610, which is proportional to the square of the voltage at the gate of the first transistor 610 (i.e., the input 352 of the first squaring circuit 350).

The second squaring circuit 360 includes a second transistor 620, in which the gate of the second transistor 620 is coupled to the second terminal 338 of the second inductor 335 and the source of the second transistor 620 is coupled to ground. In this example, the power detector 210 includes a second current source 635 coupled between the supply rail and the drain of the second transistor 620 to provide the second transistor 620 with bias current. The bias circuit 340 biases the gate of the second transistor 620 with the bias voltage Vb via the second inductor 335, which acts as a DC short. In this example, the input 362 of the second squaring circuit 360 is located at the gate of the second transistor 620, and the output 364 of the second squaring circuit 360 is located at the drain of the second transistor 620.

In operation, the second transistor 620 generates a drain current that is proportional to the square of the voltage at the gate of the second transistor 620 based on a square law relationship between the drain current of the second transistor 620 and the gate voltage of the second transistor 620. Thus, in this example, the second square signal of the second squaring circuit 360 is provided by the drain current of the second transistor 620, which is proportional to the square of the voltage at the gate of the second transistor 620 (i.e., the input 362 of the second squaring circuit 360).

In the example shown in FIG. 6, each of the first and second transistors 610 and 620 is implemented with an n-type field effect transistor (NFET). However, it is to be appreciated that the first and second transistors 610 and 620 may be implemented with other types of transistors.

In the example shown in FIG. 6, the first low-pass filter 520 includes a first capacitor C1 coupled between the output 354 of the first squaring circuit 350 and ground. The first capacitor C1 filters out the second harmonic component of the first square signal by acting as a short to ground at the second harmonic frequency. The first capacitor C1 may include a metal capacitor, a metal-oxide-semiconductor (MOS) capacitor, and/or another type of capacitor. In some implementations, the first capacitor C1 may be implemented with parasitic capacitance of the first transistor 610 and/or the first current source 630. Parasitic capacitance of an electronic device is capacitance inherent in the structure of the device and may be undesirable in some applications because parasitic capacitance limits the frequency response of the device. In this example, the parasitic capacitance of the first transistor 610 and/or the first current source 630 may be exploited to filter out the second harmonic frequency without the need of adding a separate capacitor for the low-pass filtering.

In the example shown in FIG. 6, the second low-pass filter 525 includes a second capacitor C2 coupled between the output 364 of the second squaring circuit 360 and ground. The second capacitor C2 filters out the second harmonic component of the second square signal by acting as a short to ground at the second harmonic frequency. The second capacitor C2 may include a metal capacitor, a MOS capacitor, and/or another type of capacitor. In some implementations, the second capacitor C2 may be implemented with parasitic capacitance of the second transistor 620 and/or the second current source 635.

FIG. 6 shows an example in which the difference circuit 370 includes a transimpedance amplifier 640 configured to generate a differential difference signal that is proportional to the difference between the filtered first square signal and the filtered second square signal by the gain of the amplifier 640. In this example, the output 376 of the difference circuit 370 is a differential output including a first output 376-1 and a second output 376-2. In this example, the filtered first square signal and the filtered second square signal are currents and the differential difference signal is a differential voltage.

In this example, the transimpedance amplifier 640 includes a differential amplifier 650 having a first input 652 coupled to the first input 372 of the difference circuit 370, a second input 654 coupled to the second input 374 of the difference circuit 370, a first output 656 coupled to the first output 376-1 of the difference circuit 370, and a second output 658 coupled to the second output 376-2 of the difference circuit 370. The transimpedance amplifier 640 also includes a first feedback resistor 660 coupled between the first output 656 and the first input 652 of the amplifier 650, and a second feedback resistor 665 coupled between the second output 658 of the amplifier 650 and the second input 654 of the amplifier 650. In this example, the gain of the transimpedance amplifier 640 is set by the resistances of the feedback resistors 660 and 665.

It is to be appreciated that the difference circuit 370 is not limited to the exemplary implementation shown in FIG. 6. In general, the difference circuit 370 may be implemented with any differential amplifier configured to generate a difference signal at the output of the differential amplifier that is proportional to the difference between the filtered first square signal and the filtered second square signal. The output of the differential amplifier may be differential or single-ended, and the difference signal may be a differential signal or a single-ended signal.

In certain aspects, the load measurement circuit 250 may include one or more ADCs configured to convert the difference signal into one or more digital signals (i.e., digital values). In these aspects, the load measurement circuit 250 may compute the phase angle in the digital domain, and compute the admittance value and/or impedance value in the digital domain.

In some implementations, the filtered first square signal and the filtered second square signal may be converted into digital signals by one or more ADCs (not shown), and the difference circuit 370 may generate the difference signal in the digital domain. In this example, the difference signal is a digital difference signal.

Figure 7:
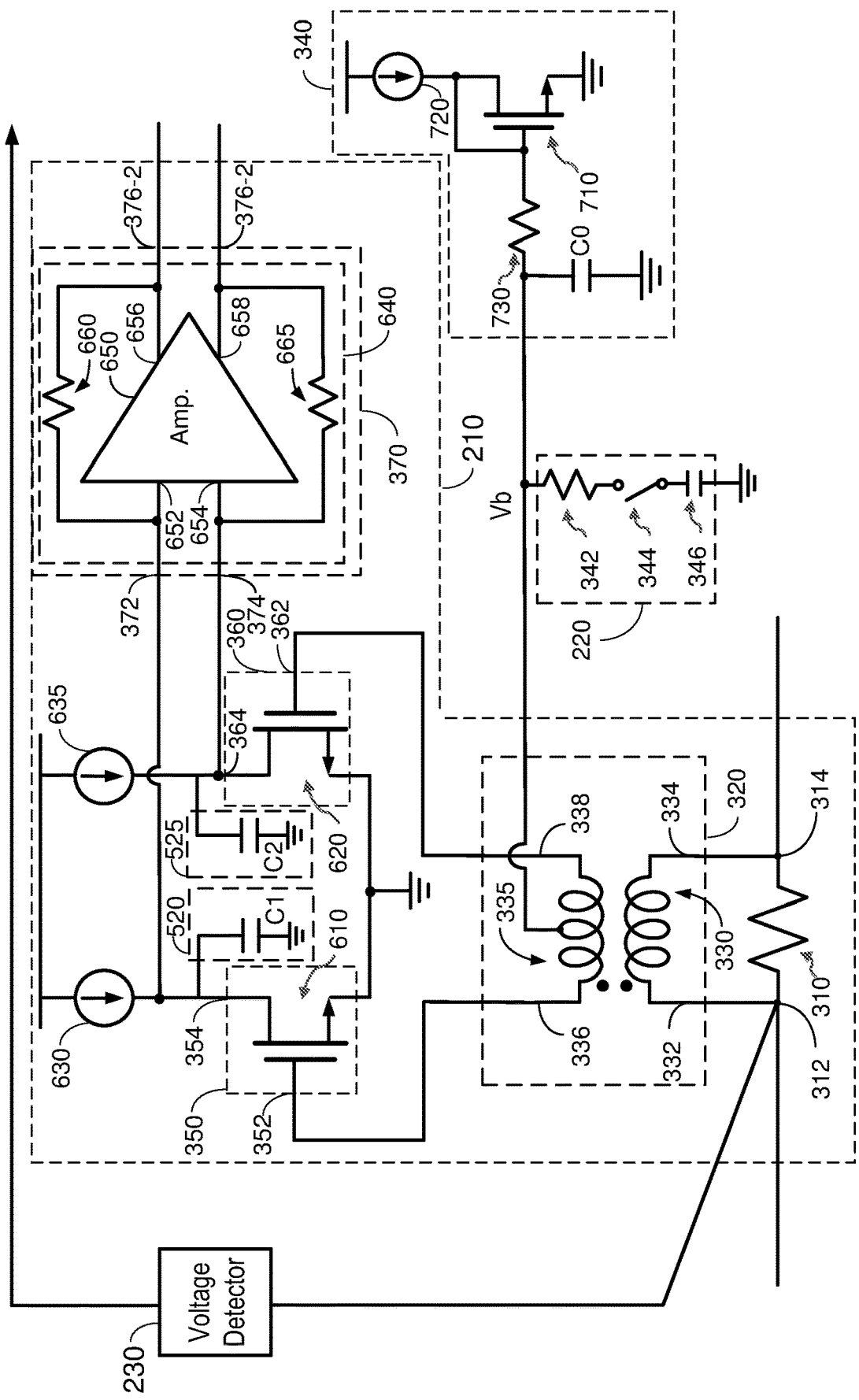
FIG. 7 shows an exemplary implementation of a bias circuit according to certain aspects of the present disclosure.

FIG. 7 shows an exemplary implementation of the bias circuit 340 according to certain aspects of the present disclosure. In this example, the bias circuit 340 includes a third transistor 710, a third current source 720, a resistor 730, and a capacitor C0. In this example, the third current source 720 is coupled between the supply rail and the drain of the third transistor 710, and the source of the third transistor 710 is coupled to ground. The drain of the third transistor 710 is coupled to the gate of the third transistor 710 to generate a bias voltage at the gate of the third transistor 710. In the example shown in FIG. 7, the resistor 730 is coupled between the gate of the third transistor 710 and the center tap of the second inductor 335, and the capacitor C0 is coupled between the resistor 730 and ground. In this example, the resistor 730 and the capacitor C0 form a low-pass RC filter that filters out noise from the bias voltage.

Figure 8:
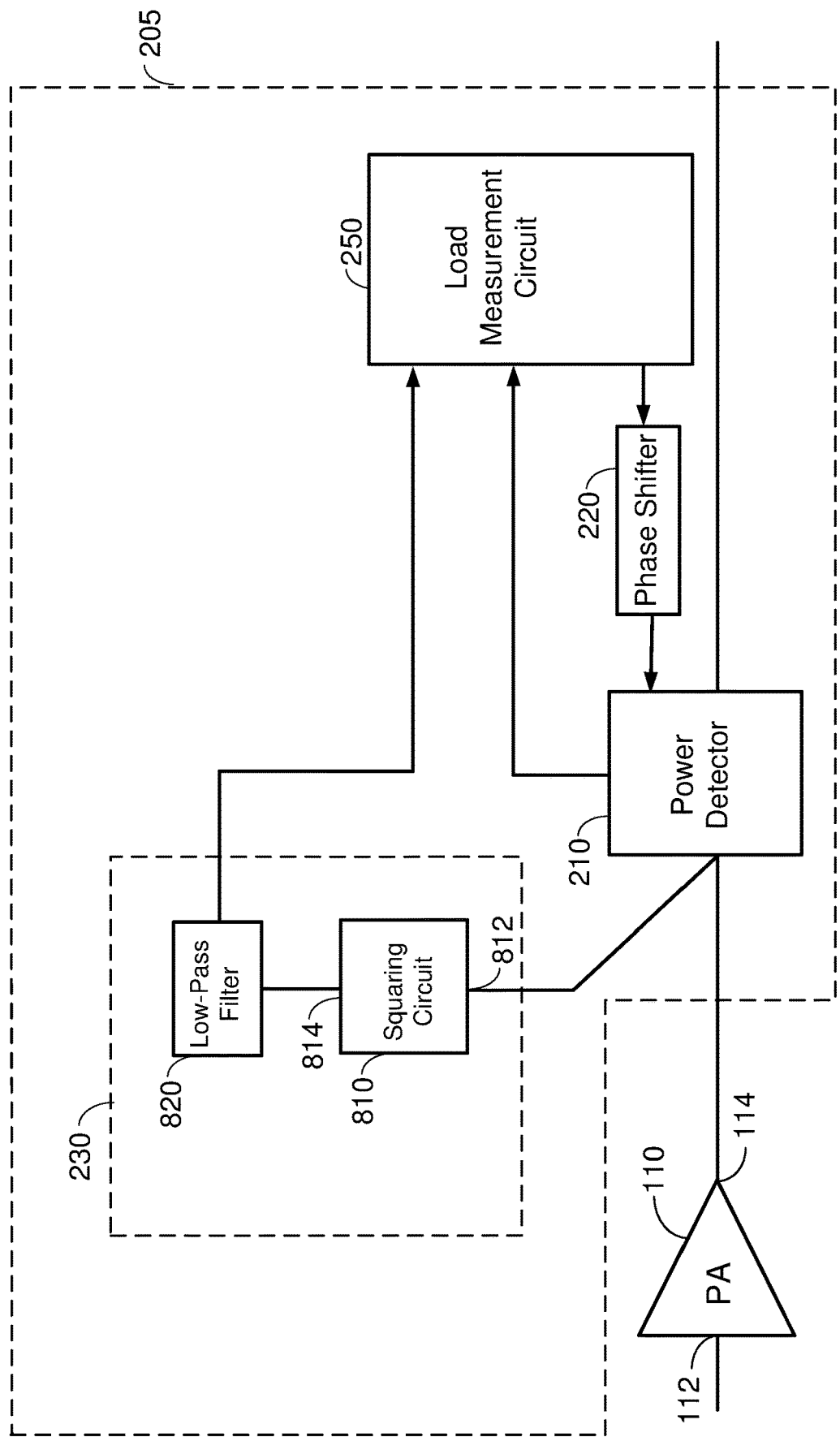
FIG. 8 shows an exemplary implementation of a voltage detector according to certain aspects of the present disclosure.

FIG. 8 shows an exemplary implementation of the voltage detector 230 according to certain aspects. In this example, the voltage detector 230 includes a squaring circuit 810 and a low-pass filter 820. The squaring circuit 810 has an input 812 and an output 814. The input 812 of the squaring circuit 810 is coupled between the output 114 of the PA 110 and the power detector 210. For the example where the power detector 210 includes the resistive element 310, the input 812 of the squaring circuit 810 may be coupled to the first terminal 312 of the resistive element 310. The low-pass filter 820 is coupled between the output 814 of the squaring circuit 810 and the load measurement circuit 250.

In operation, the squaring circuit 810 is configured to generate a square signal at the output 814 of the squaring circuit 810 that is proportional to the square of the voltage at the input 812 of the squaring circuit 810. The square signal includes a component that is proportional to the square of the magnitude of the voltage at the input 812 and a second harmonic component. The low-pass filter 820 filters out the second harmonic component, leaving the component that is proportional to the square of the magnitude of the voltage in the resulting filtered square signal. Thus, the filtered square signal provides the load measurement circuit 250 with a measurement of the square of the magnitude of the voltage, which the load measurement circuit 250 may use to compute the load admittance value (e.g., based on equation (9)).

Figure 9:
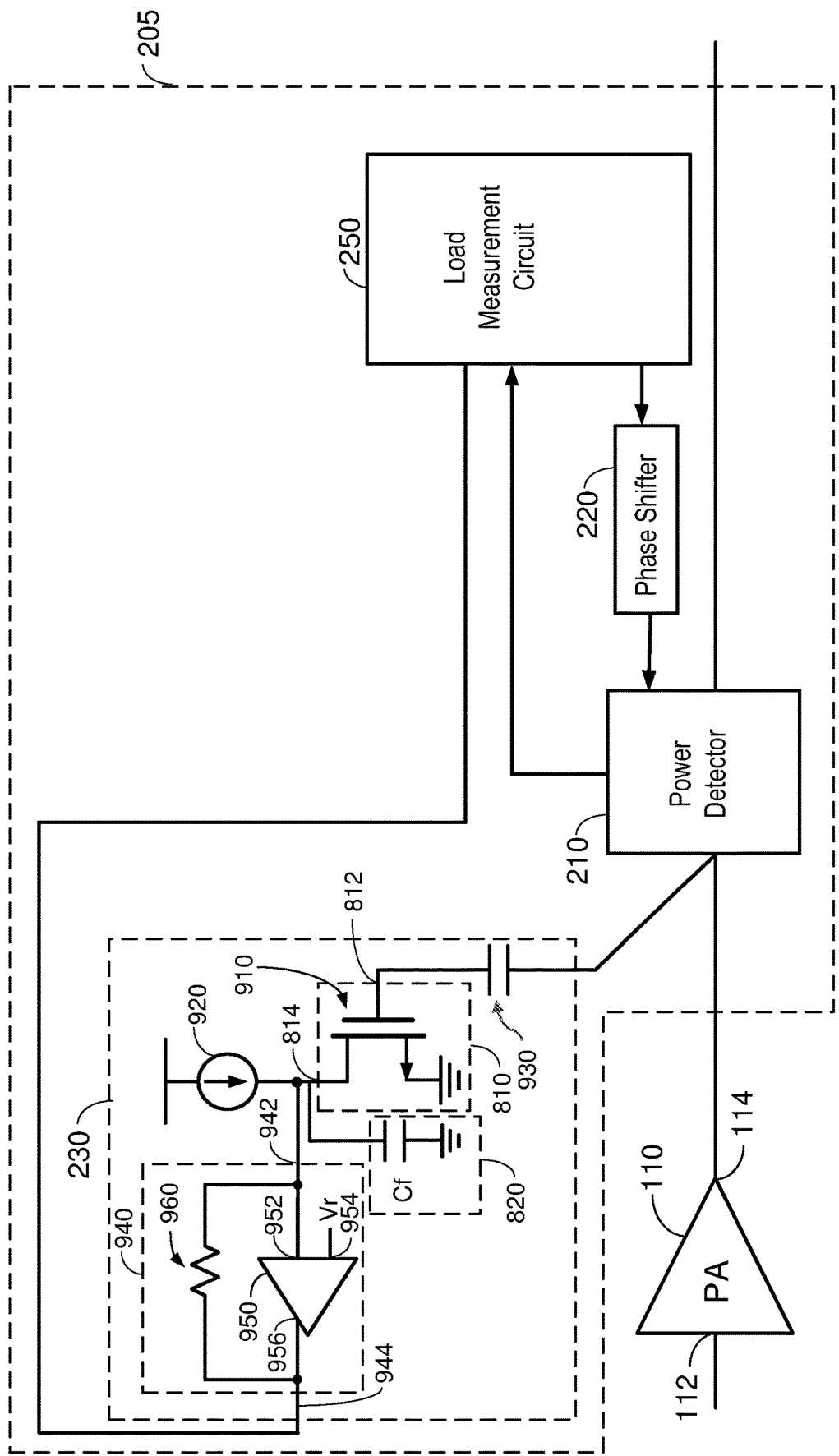
FIG. 9 shows an exemplary implementation of a squaring circuit in the voltage detector according to certain aspects of the present disclosure.

FIG. 9 shows an exemplary implementation of the squaring circuit 810 and the low-pass filter 820 according to certain aspects. In this example, the squaring circuit 810 includes a transistor 910, in which the source of the transistor 910 is coupled to ground. The input 812 of the squaring circuit 810 is located at the gate of the transistor 910 and the output 814 of the squaring circuit 810 is located at the drain of the transistor 910. In this example, the voltage detector 230 includes a current source 920 coupled between the supply rail and the drain of the transistor 910 to provide the transistor 910 with bias current. The gate of the transistor 910 may be biased by the bias voltage generated by the bias circuit 340 (not shown in FIG. 9). In this example, the voltage detector 230 also includes an AC coupling capacitor 930 coupled between the gate of the transistor 910 and the first terminal 312 of the resistive element 310 (not shown in FIG. 9).

In operation, the transistor 910 generates a drain current that is proportional to the square of the voltage at the gate of the transistor 910 based on a square law relationship between the drain current of the transistor 910 and the gate voltage of the transistor 910. The drain current includes a component that is proportional to the square of the magnitude of the voltage at the input 812 and a second harmonic component, in which the second harmonic component is filtered out by the low-pass filter 820.

In the example in FIG. 9, the low-pass filter 820 includes a capacitor Cf coupled between the output 814 of the squaring circuit 810 and ground. The capacitor Cf filters out the second harmonic component of the first square signal by acting as a short to ground at the second harmonic frequency. The capacitor Cf may include a metal capacitor, a MOS capacitor, and/or another type of capacitor. In some implementations, the capacitor Cf may be implemented with parasitic capacitance of the transistor 910 and/or the current source 920.

In the example in FIG. 9, the voltage detector 230 includes a transimpedance amplifier 940 having an input 942 coupled to the drain of the transistor 910 and an output 944 coupled to the load measurement circuit 250. The transimpedance amplifier 940 is configured to convert the filtered drain current of the transistor 910 at the input 942 into an output voltage at the output 944 that is proportional to the square of the magnitude of the voltage at the input 812 of the squaring circuit 810. The output voltage provides the load measurement circuit 250 with a measurement of the square of the magnitude of the voltage, which the load measurement circuit 250 may use to compute the load admittance value (e.g., based on equation (9)).

In the example in FIG. 9, the transimpedance amplifier 940 includes an amplifier 950 having a first input 952 coupled to the drain of the transistor 910, a second input 954 coupled to a reference voltage Vr, and an output 956 coupled to the load measurement circuit 250. The transimpedance amplifier 940 also includes a feedback resistor 960 coupled between the output 956 and the first input 952 of the amplifier 950, in which the gain of the transimpedance amplifier 940 is set by the resistance of the feedback resistor 960.

Figure 10:
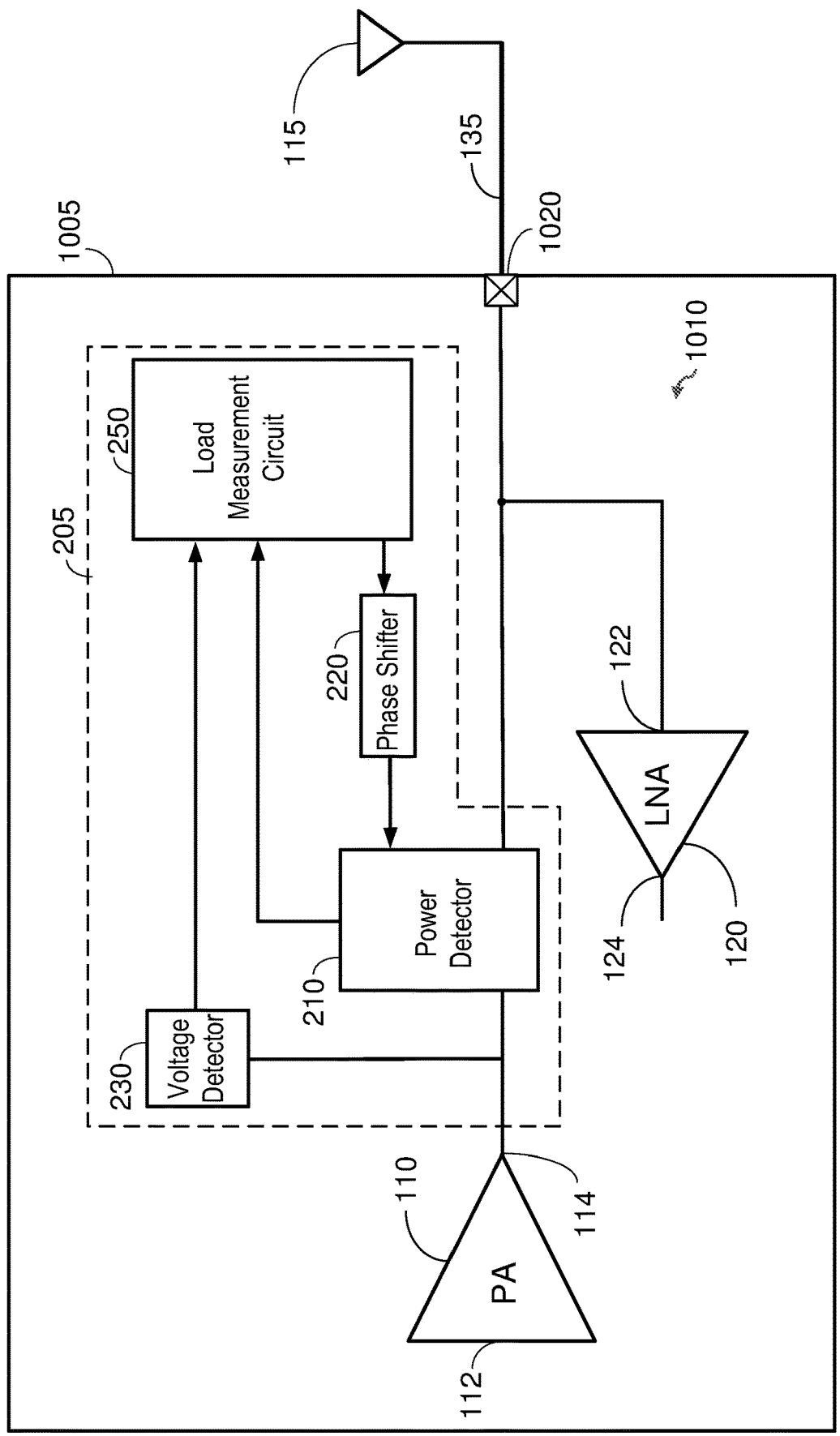
FIG. 10 shows an example of a transceiver according to certain aspects of the present disclosure.

FIG. 10 shows an exemplary transceiver 1010 in which the circuit 205 may be used according to aspects of the present disclosure. In this example, the transceiver 1010 includes the PA 110 and the LNA 120, which share the antenna 115. In this example, the PA 110, the LNA 120, and the circuit 205 are integrated on a chip 1005. The chip 1005 includes a pad 1020 for coupling the chip 1005 to the antenna 115. In this example, the pad 1020 may be coupled to the antenna 115 via a bump (e.g., bump 130 shown in FIG. 1) and route 135 (e.g., transmission line, metal trace, cable, etc.). In one example, the chip 1005 and the antenna 115 may be mounted on a substrate (e.g., printed circuit board) in which the route 135 includes one or more metal traces on the substrate coupled between the pad 1020 and the antenna 115.

In this example, the power detector 210 is coupled between the output 114 of the PA 110 and the pad 1020. The load measured by the circuit 205 may include the loads of the pad 1020, the antenna 115, the route 135, and the bump 130 (shown in FIG. 1). Note that in FIGS. 2-5, the load is represented by load 215. For the example in which the power detector 210 measures power using the resistive element 310, the resistive element 310 is coupled between the output 114 of the PA 110 and the pad 1020. In this example, the input 122 of the LNA 120 is coupled to the pad 1020.

The transceiver 1010 may operate in a transmit mode or a receive mode. In the transmit mode, the PA 110 receives an RF signal at the input 112 of the PA 110 (e.g., from a frequency up-converter), amplifies the received RF signal, and outputs the amplified RF signal at the output 114 of the PA 110 for transmission via the antenna 115. In the receive mode, the LNA 120 receives an RF signal at the input 122 of the LNA 120 from the antenna 115, amplifies the received RF signal, and outputs the amplified RF signal at the output 124 of the LNA 120 (e.g., to a frequency down-converter).

In this example, the circuit 205 may be used to measure the admittance and/or impedance of the load seen at the output 114 of the PA 110. The circuit 205 may also be used to measure the admittance and/or impedance of the load seen at the input 122 of the LNA 120 since the input 122 of the LNA 120 is also coupled to the pad 1020.

FIG. 11 shows an example of the transceiver 1010 in which the resistive element 310 in the power detector 210 is implemented with a power switch 1110. In this example, the power detector 210 may be implemented with any one of the exemplary implementations of the power detector 210 shown in FIGS. 3-7. For ease of illustration, only the resistive element 310 and the transformer 320 of the power detector 210 are shown in FIG. 11. In the example in FIG. 11, the power switch 1110 is implemented with an NFET. However, it is to be appreciated that the power switch 1110 may be implemented with a different type of transistor (e.g., PFET).

In this example, the power switch 1110 is controlled by a controller 1120. For the example in which the power switch 1110 is implemented with a NFET, the controller 1120 is coupled to the gate of the NFET. In this example, the controller 1120 turns on the power switch 1110 by applying a high voltage on the gate of the NFET and turns off the power switch 1110 by applying a low voltage on the gate of the NFET.

In the transmit mode, the controller 1120 turns on (i.e., closes) the power switch 1110. In this mode, the power switch 1110 couples the output 114 of the PA 110 to the pad 1020, which is coupled to the antenna 115. In the receive mode, the controller 1120 turns off (i.e., opens) the power switch 1110. In this mode, the power switch 1110 decouples the output 114 of the PA 110 from the pad 1020. This may be done, for example, to prevent the output 114 of the PA 110 from loading the input 122 of the LNA 120 in the receive mode.

To measure the admittance and/or impedance of the load using the circuit 205, the controller 1120 turns on the power switch 1110. In this example, the on resistance of the power switch 1110 provides the resistance of the resistive element 310 for measuring the power delivered to the load. The on resistance is the resistance of the power switch 1110 when the power switch 1110 is turned on.

It is to be appreciated that the transceiver 1010 may include one or more additional components in the transmit path between the output 114 of the PA 110 and the pad 1020 not shown in FIG. 11. For example, the transceiver 1010 may also include a transformer (not shown) coupling the output 114 of the PA 110 to the resistive element 310 (e.g., power switch 1110). In this example, the transformer may be used to provide impedance matching between the output 114 of the PA 110 and the load. It is also to be appreciated that the transceiver 1010 may include one or more additional components (e.g., inductor) in the receive path between the pad 1020 and the input 122 of the LNA 120 not shown in FIG. 11.

Figure 12:
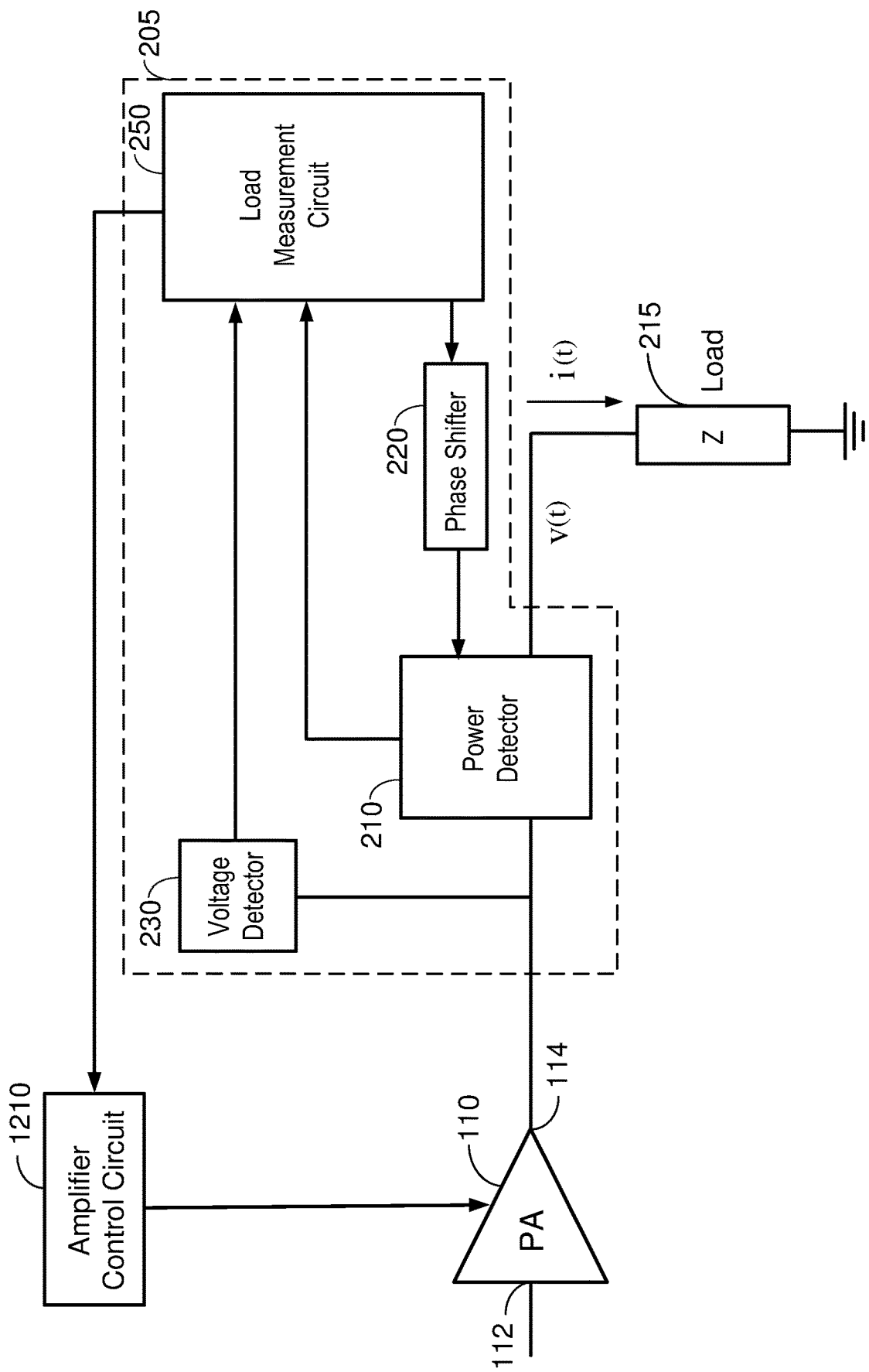
FIG. 12 shows an example of an amplifier control circuit for controlling an output voltage swing of a power amplifier according to certain aspects of the present disclosure.

As discussed above, the load measurement circuit 250 may use the impedance value or admittance value for the load 215 to protect the PA 110 from excessive output voltage swings due to a large increase in the load impedance. In this regard, FIG. 12 shows an example in which the transmitter includes an amplifier control circuit 1210 coupled to the load measurement circuit 250 and the PA 110. The amplifier control circuit 1210 is configured to control the voltage swing at the output 114 of the PA 110 (i.e., output voltage swing) under the control of the load measurement circuit 250. For example, the amplifier control circuit 1210 may control the output voltage swing by controlling the gain of the PA 110. In this example, the amplifier control circuit 1210 may decrease the output voltage swing by decreasing the gain of the PA 110.

In this example, the load measurement circuit 250 may detect a large increase in the load impedance when the impedance value exceeds an impedance threshold or the admittance value falls below an admittance threshold (which is indicative of a high impedance). A large increase in the load impedance may be due to an open circuit or another fault. In response to detecting a large increase in the load impedance, the load measurement circuit 250 may direct (i.e., instruct) the amplifier control circuit 1210 to decrease the output voltage swing of the PA 110 (e.g., by decreasing the gain of the PA 110).

Figure 13:
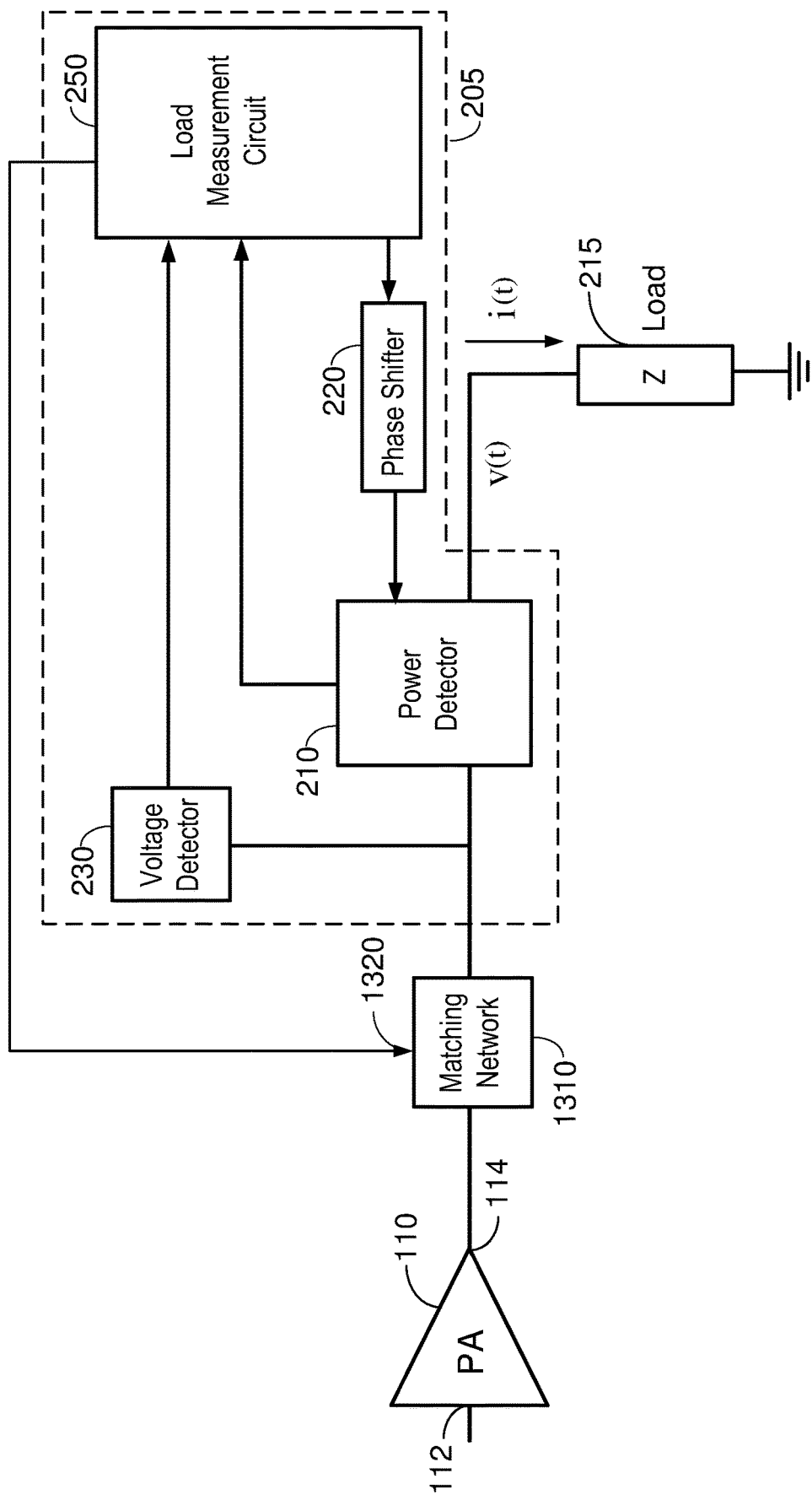
FIG. 13 shows an example of a tunable impedance matching network coupled between a power amplifier and an antenna according to certain aspects of the present disclosure.

FIG. 13 shows an example in which the transmitter includes a tunable impedance matching network 1310 coupled between the output 114 of the PA 110 and the load 215. The impedance matching network 1310 is configured to transform the impedance of the load 215 into a desired impedance at the output 114 of the PA 110. In this example, the load measurement circuit 250 is coupled to a control input 1320 of the impedance matching network 1310 to control the impedance transformation of the impedance matching network 1310. In operation, the load measurement circuit 250 may tune the impedance transformation of the impedance matching network 1310 based on the impedance value or admittance value for the load 215 to provide the desired impedance at the output 114 of the PA 110.

Figure 14:
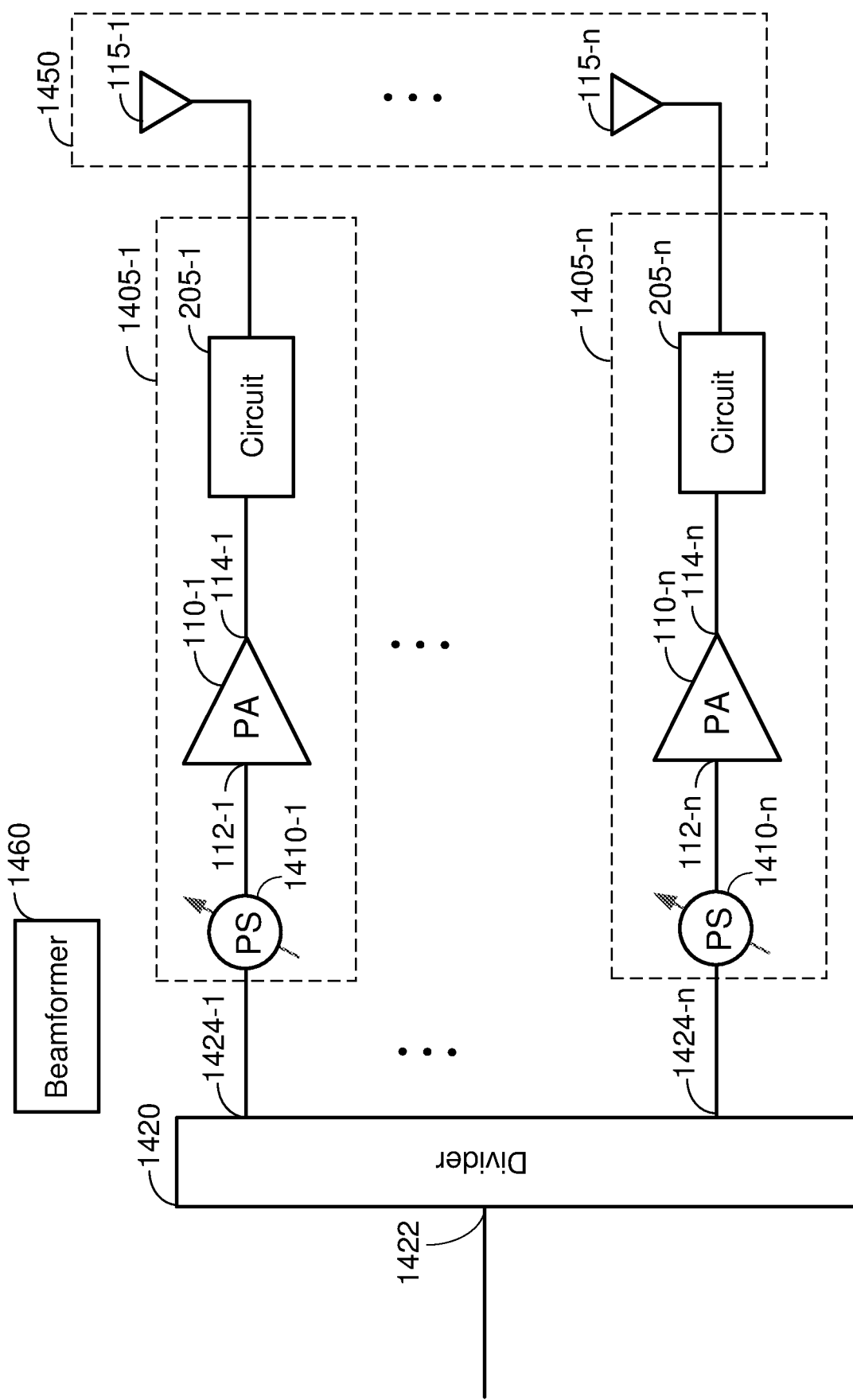
FIG. 14 shows an example of a phased antenna array with which aspects of the present disclosure may be used according to certain aspects of the present disclosure.

Although one antenna 115 is shown in FIGS. 10 and 11, it is to be appreciated that the wireless device may include multiple antennas. For example, FIG. 14 shows an example in which the wireless device includes a phased antenna array 1450 including multiple antennas 115-1 to 115-n for transmitting RF signals and/or receiving RF signals in a desired direction. In this example, the wireless device includes a divider 1420, multiple transmit chains 1405-1 to 1405-n, and a beamformer 1460. The divider 1420 has an input 1422 and multiple outputs 1424-1 to 1424-n. The divider 1420 is configured to receive an RF signal at the input 1422 (e.g., from a frequency-up converter or another device), split the RF signal into multiple RF signals, and output each of the multiple RF signals at a respective one of the multiple outputs 1424-1 to 1424-n.

Each transmit chain 1405-1 to 1405-n is coupled between a respective one of the outputs 1424-1 to 1424-n of the divider 1420 and a respective one of the antennas 115-1 to 115-n of the antenna array 1450. Each of the transmit chains 1405-1 to 1405-n includes a respective phase shifter 1410-1 to 1410-n, a respective PA 110-1 to 110-n, and a respective circuit 205-1 to 205-n for measuring the impedance and/or admittance of the respective load (which includes the load of the respective antenna 115-1 to 115-n). Each of the circuits 205-1 to 205-n may be implemented with any one of the exemplary implementations of the circuit 205 shown in FIGS. 2-13.

Each of the phase shifters 1410-1 to 1410-n is configured to shift the phase of the signal in the respective transmit chain 1405-1 to 1405-n under the control of the beamformer 1460. For ease of illustration, the individual connections between the beamformer 1460 and the phase shifters 1410-1 to 1410-n are not explicitly shown in FIG. 14. In operation, the beamformer 1460 uses the phase shifters 1410-1 to 1410-n to shift the phases of the signals in the transmit chains 1405-1 to 1405-n by respective phase shifts to achieve a desired transmit beam direction for the antenna array 1450.

In the example illustrated in FIG. 14, each of the circuits 205-1 to 205-n may be a separate instance of the circuit 205 for measuring the respective load admittance and/or load impedance. Each instance of the circuit 205-1 to 205-m may include a respective power detector 210 coupled between the respective PA 110-1 to 110-n and the respective antenna 115-1 to 115-n, a respective phase shifter 220, a respective voltage detector 230, and a respective load measurement circuit 250 (shown in FIG. 2). In some implementations, the circuits 205-1 to 205-n may share the load measurement circuit 250. In this example, the power detector 210, the phase shifter 220, and the voltage detector 230 in each of the circuits 205-1 to 205-n may be coupled to the shared load measurement circuit 250, in which the shared load measurement circuit 250 may compute load impedance and/or load admittance for each of the antennas 115-1 to 115-n.

Figure 15:
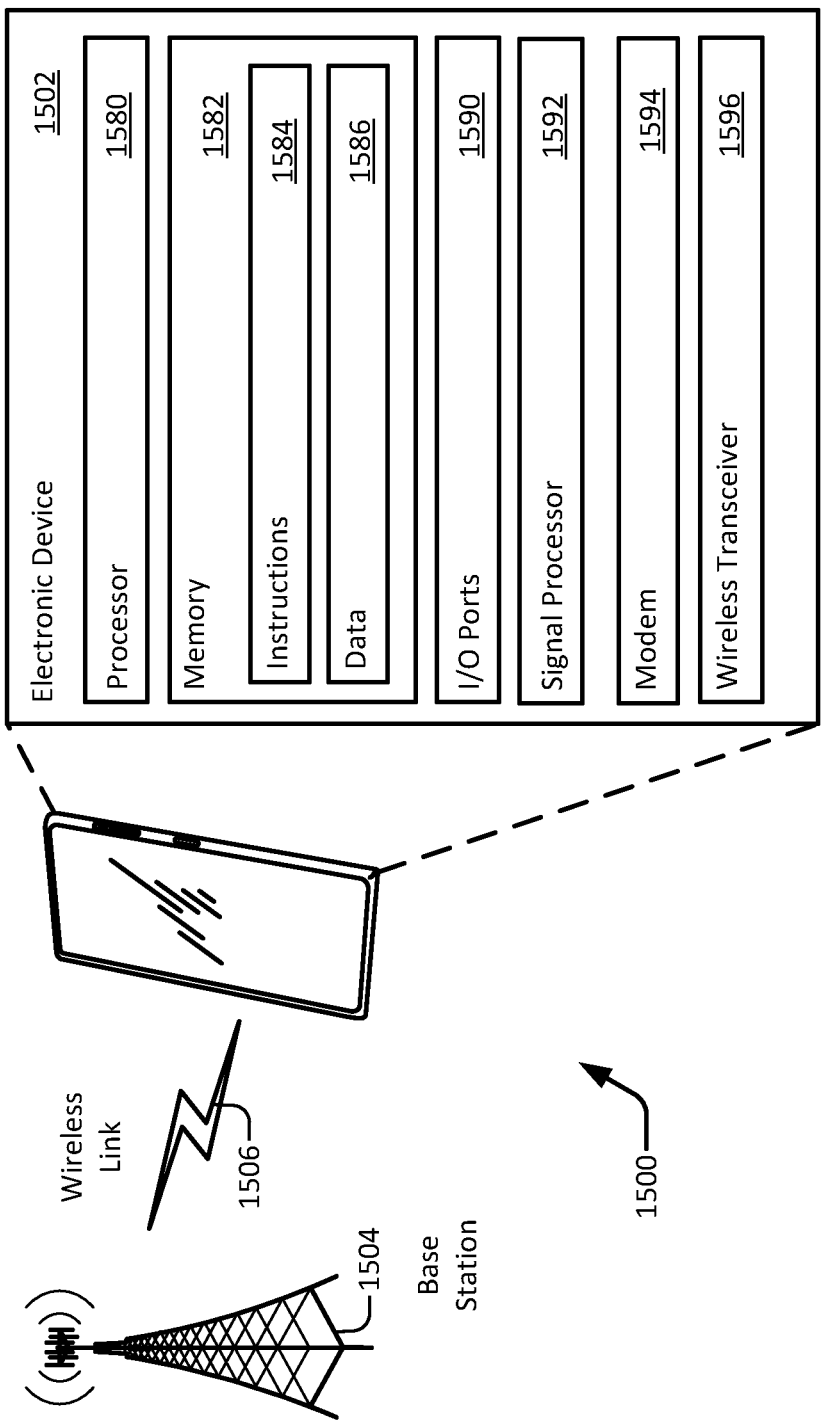
FIG. 15 is a diagram of an environment that includes an electronic device that includes a transceiver according to certain aspects of the present disclosure.

FIG. 15 is a diagram of an environment 1500 that includes an electronic device 1502 that includes a wireless transceiver 1596. The transceiver 1596 may include the transceiver 1010, the circuit 205, the PA 110, the LNA 120, the power detector 210, the load measurement circuit 250, the phase shifter 220, and/or the voltage detector 230 according to various aspects of the present disclosure. In the environment 1500, the electronic device 1502 communicates with a base station 1502 via a wireless link 1506. As shown, the electronic device 1502 is depicted as a smart phone. However, the electronic device 1502 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1502 communicates with the electronic device 1502 via the wireless link 1506, which may be implemented as any suitable type of wireless link Although depicted as a base station tower of a cellular radio network, the base station 1502 may represent or be implemented as another device, such as a satellite, terrestrial broadcast tower, access point, peer to peer device, mesh network node, fiber optic line, another electronic device generally as described above, and so forth. Hence, the electronic device 1502 may communicate with the base station 1502 or another device via a wired connection, a wireless connection, or a combination thereof. The wireless link 1506 can include a downlink of data or control information communicated from the base station 1502 to the electronic device 1502 and an uplink of other data or control information communicated from the electronic device 1502 to the base station 1502. The wireless link 1506 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1502 includes a processor 1580 and a memory 1582. The memory 1582 may be or form a portion of a computer readable storage medium. The processor 1580 may include any type of processor, such as an application processor or a multi-core processor, that is configured to execute processor-executable instructions (e.g., code) stored by the memory 1582. The memory 1582 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1582 is implemented to store instructions 1584, data 1586, and other information of the electronic device 1502, and thus when configured as or part of a computer readable storage medium, the memory 1582 does not include transitory propagating signals or carrier waves.

The electronic device 1502 may also include input/output ports 1590. The I/O ports 1590 enable data exchanges or interaction with other devices, networks, or users or between components of the device.

The electronic device 1502 may further include a signal processor (SP) 1592 (e.g., such as a digital signal processor (DSP)). The signal processor 1592 may function similar to the processor and may be capable executing instructions and/or processing information in conjunction with the memory 1582.

For communication purposes, the electronic device 1502 also includes a modem 1594, the wireless transceiver 1596, and an antenna (e.g., antenna 115). The wireless transceiver 1596 provides connectivity to respective networks and other electronic devices connected therewith using RF wireless signals. The wireless transceiver 1596 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 16:
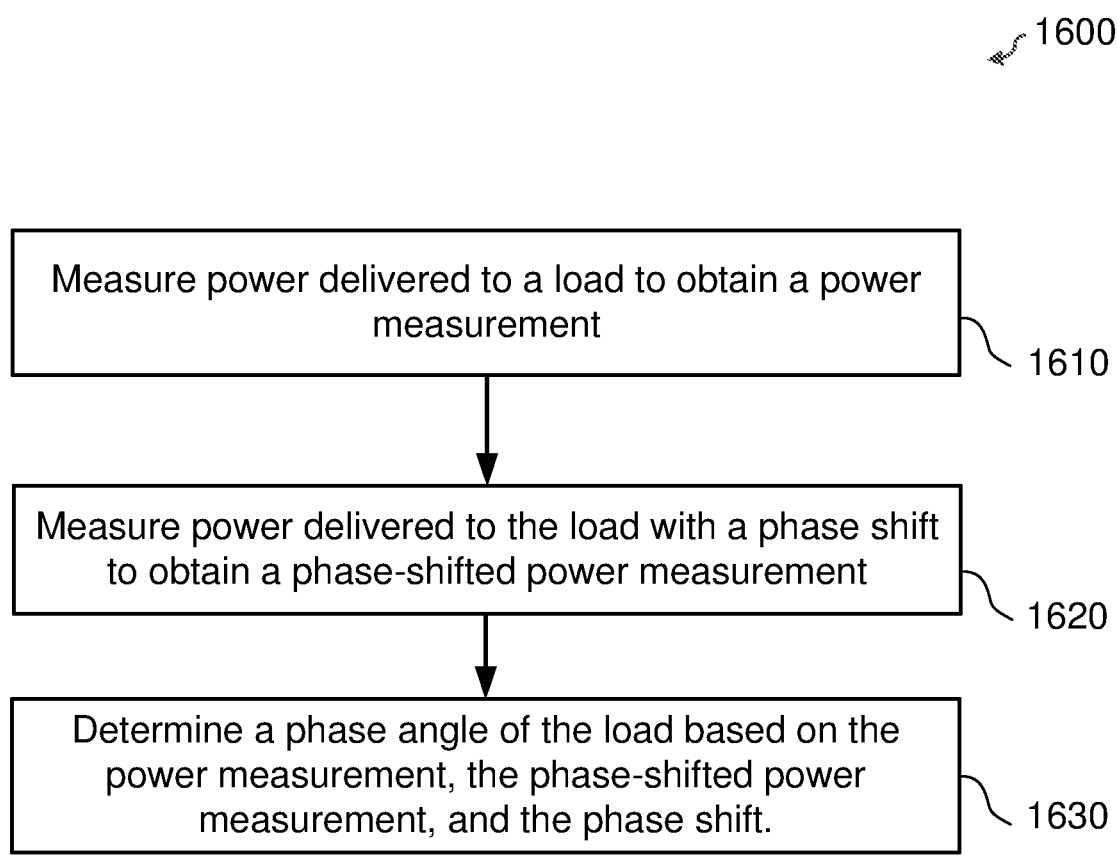
FIG. 16 is a flowchart illustrating an example of a method for measuring a load according to certain aspects of the present disclosure.

FIG. 16 illustrates a method 1600 for measuring a load (e.g., load 215) according to certain aspects. The load may have a complex impedance and may include the load of an antenna (e.g., antenna 115). The method 1600 may be performed by the power detector 210, the phase shifter 220, and the load measurement circuit 250.

At block 1610, power delivered to the load is measured to obtain a power measurement. The power measurement may be performed by the power detector 210. In one example, the power measurement may be proportional to an average power delivered to the load.

At block 1620, power delivered to the load is measured with a phase shift to obtain a phase-shifted power measurement. The power measurement with the phase shift may be performed by the power detector 210 and the phase shifter 220.

At block 1630, a phase angle of the load is determined based on the power measurement, the phase-shifted power measurement, and the phase shift. For example, the phase angle may be determined by the load measurement circuit 250 (e.g., based on equation (8)). The phase shift may be a known phase shift of the phase shifter 220.

In certain aspects, the method 1600 may include measuring a voltage on a path coupled to the load to obtain a voltage measurement, and determining an admittance value or an impedance value for the load based on the voltage measurement and the determined phase angle. For example, the path may be between a PA (e.g., PA 110) and the load (e.g., load 215). The voltage may be measured by the voltage detector 230 and the admittance value or the impedance value may be determined by the load measurement circuit 250. The admittance value may be proportional to a magnitude of an admittance of the load and the impedance value may be proportional to a magnitude of an impedance of the load.

In certain aspects, measuring the voltage may include squaring the voltage to generate a square signal proportional to a square of the voltage, and low-pass filtering the square signal to obtain the voltage measurement. The squaring may be performed by the squaring circuit 810 and the low-pass filtering may be performed by the low-pass filter 820.

In certain aspects, determining the phase angle of the load includes determining a ratio of the power measurement and the phase-shifted power measurement, and determining the phase angle based on the determined ratio and the phase shift.

In certain aspects, measuring the power delivered to the load with the phase shift includes enabling a phase shifter coupled to a power detector, the phase shifter including a resistive element and a reactive element, and measuring the power delivered to the load using the power detector with the phase shifter enabled. The phase shifter may correspond to the phase shifter 220, and the power detector may correspond to the power detector 210. The phase shifter may be enabled by the load measurement circuit 250. The resistive element may include a resistor (e.g., resistor 342 or 442) and the reactive element may include a capacitor (e.g., capacitor 346) or an inductor (e.g., inductor 446).

In certain aspects, measuring power delivered to the load to obtain the power measurement includes disabling the phase shifter, and measuring power delivered to the load using the power detector with the phase shifter disabled.

In certain aspects, the phase shifter includes a switch (e.g., switch 344 or 444). In these aspects, disabling the phase shifter comprises opening the switch, and enabling the phase shifter comprises closing the switch.

In certain aspects, a resistive element (e.g., resistive element 310) is coupled between a power amplifier (e.g., PA 110) and the load (e.g., load 215). In one example, the resistive element includes a switch (e.g., switch 1110). In these aspects, measuring the power delivered to the load to obtain the power measurement may include squaring a voltage from a first terminal of the resistive element to obtain a first square signal, squaring a voltage from a second terminal of the resistive element to obtain a second square signal, and generating a difference signal based on a difference between the first square signal and the second square signal. The voltage from the first terminal (e.g., first terminal 312) may be squared by the first squaring circuit 350, the voltage from the second terminal (e.g., terminal 314) may be squared by the second squaring circuit 360, and the difference signal may be generated by the difference circuit 370. The difference circuit 370 may include a differential amplifier (e.g., differential amplifier 650), and the difference signal may be differential or single-ended.

In certain aspects, the method 1600 may include low-pass filtering the first square signal to obtain a filtered first square signal, and low-pass filtering the second square signal to obtain a filtered second square signal, wherein generating the difference signal based on a difference between the first square signal and the second square signal comprises generating the difference signal based on a difference between the filtered first square signal and the filtered second square signal. For example, the first square signal may be low-pass filtered by the first low-pass filter 520, and the second square signal may be low-pass filtered by the second low-pass filter 525. In these aspects, the difference signal provides the power measurement and may be proportional to an average power delivered to the load.

In certain aspects, the method 1600 may include low-pass filtering the difference signal. For example, the filtered difference signal provides the power measurement and may be proportional to an average power delivered to the load. The difference signal may be low-pass filtered by the low-pass filter 380.

The load measurement circuit 250 may be implemented with a general-purpose processor, a digital signal processor (DSP), a state machine, an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a power detector, wherein the power detector comprises:
  a resistive element coupled between a power amplifier and an antenna; and
  a transformer including a first inductor and a second inductor, wherein the first inductor is coupled in parallel with the resistive element, and the second inductor is magnetically coupled with the first inductor;
a voltage detector coupled between the power amplifier and the antenna;
a phase shifter coupled to the second inductor; and
a load measurement circuit coupled to the power detector, the voltage detector, and the phase shifter.

2. The apparatus of claim 1, wherein the phase shifter comprises:
a second resistive element;
a reactive element; and
a switch coupled to the second resistive element and the reactive element.

3. The apparatus of claim 1, wherein:
the load measurement circuit is configured to disable the phase shifter during a first time period;
the power detector is configured to measure power delivered to a load during the first time period to obtain a power measurement, and output the power measurement to the load measurement circuit, the load including a load of the antenna;
the load measurement circuit is configured to enable the phase shifter during a second time period;
the power detector is configured to measure power delivered to the load during the second time period to obtain a phase-shifted power measurement, and output the phase-shifted power measurement to the load measurement circuit; and
the load measurement circuit is configured to determine a phase angle based on the power measurement, the phase-shifted power measurement, and a phase shift of the phase shifter.

4. The apparatus of claim 3, wherein:
the voltage detector is configured to measure a voltage between the power amplifier and the antenna to obtain a voltage measurement, and output the voltage measurement to the load measurement circuit; and
the load measurement circuit is configured to determine an admittance value or an impedance value based on the voltage measurement and the determined phase angle.

5. The apparatus of claim 4, wherein the voltage measurement is proportional to a square of a magnitude of the voltage between the power amplifier and the antenna.

6. The apparatus of claim 4, further comprising an impedance matching network coupled between the power amplifier and the antenna, wherein the load measurement circuit is configured to tune an impedance transformation of the impedance matching network based on the admittance value or the impedance value.

7. The apparatus of claim 4, further comprising an amplifier control circuit configured to control an output voltage swing of the power amplifier, wherein the load measurement circuit is configured to instruct the amplifier control circuit to adjust the output voltage swing based on the admittance value or the impedance value.

8. The apparatus of claim 1, wherein the antenna is one of multiple antennas in an antenna array.

9. The apparatus of claim 1, wherein the voltage detector comprises:
a squaring circuit having an input and an output, wherein the input of the squaring circuit is coupled between the power amplifier and the antenna; and
a low-pass filter coupled between the output of the squaring circuit and the load measurement circuit.

10. The apparatus of claim 1, wherein the phase shifter is coupled to a center tap of the second inductor.

11. The apparatus of claim 1, wherein the power detector further comprises:
a first squaring circuit including an input and an output, wherein the input of the first squaring circuit is coupled to a first terminal of the second inductor;
a second squaring circuit including an input and an output, wherein the input of the second squaring circuit is coupled to a second terminal of the second inductor; and
a difference circuit coupled to the output of the first squaring circuit, the output of the second squaring circuit, and the load measurement circuit.

12. An apparatus, comprising:
a power detector, wherein the power detector comprises:
a resistive element coupled between a power amplifier and an antenna;
a first squaring circuit including an input and an output, wherein the input of the first squaring circuit is coupled to a first terminal of the resistive element;
a second squaring circuit including an input and an output, wherein the input of the second squaring circuit is coupled to a second terminal of the resistive element; and
a difference circuit coupled to the output of the first squaring circuit, and the output of the second squaring circuit;
a voltage detector coupled between the power amplifier and the antenna;
a phase shifter coupled to the power detector; and
a load measurement circuit coupled to the difference circuit, the voltage detector, and the phase shifter.

13. The apparatus of claim 12, further comprising a low-pass filter coupled between the difference circuit and the load measurement circuit.

14. The apparatus of claim 12, further comprising:
a first low-pass filter coupled between the output of the first squaring circuit and the difference circuit; and
a second low-pass filter coupled between the output of the second squaring circuit and the difference circuit.

15. The apparatus of claim 12, wherein the power detector further comprises a transformer, the transformer comprising:
a first inductor coupled between the first terminal of the resistive element and the second terminal of the resistive element; and
a second inductor coupled between the input of the first squaring circuit and the input of the second squaring circuit, wherein the second inductor is magnetically coupled with the first inductor.

16. The apparatus of claim 15, wherein the phase shifter is coupled to the second inductor, and the phase shifter comprises:
a second resistive element;
a reactive element; and
a switch coupled to the second resistive element and the reactive element.

17. The apparatus of claim 15, wherein:
the first squaring circuit comprises a first transistor;
a gate of the first transistor is coupled to a first terminal of the second inductor;
a drain of the first transistor is coupled to the difference circuit;
the second squaring circuit comprises a second transistor;
a gate of the second transistor is coupled to a second terminal of the second inductor; and
a drain of the second transistor is coupled to the difference circuit.

18. The apparatus of claim 15, wherein the phase shifter is coupled to a center tap of the second inductor.

19. A method for measuring a load, comprising:
measuring power delivered to the load using a resistive element to obtain a power measurement, wherein the resistive element is coupled between a power amplifier and the load;
measuring power delivered to the load using the resistive element with a phase shift to obtain a phase-shifted power measurement, wherein measuring the power delivered to the load using the resistive element with the phase shift to obtain the phase-shifted power measurement comprises inducing the phase shift at a transformer coupled to the resistive element; and
determining a phase angle of the load based on the power measurement, the phase-shifted power measurement, and the phase shift.

20. The method of claim 19, further comprising:
measuring a voltage on a path coupled to the load to obtain a voltage measurement; and
determining an admittance value or an impedance value for the load based on the voltage measurement and the determined phase angle.

21. The method of claim 19, wherein the load includes a load of an antenna.

22. The method of claim 19, wherein determining the phase angle of the load comprises:
determining a ratio of the power measurement and the phase-shifted power measurement; and
determining the phase angle based on the determined ratio and the phase shift.

23. The method of claim 19, wherein inducing the phase shift at the transformer coupled to the resistive element comprises:
enabling a phase shifter coupled to the transformer, the phase shifter including a second resistive element and a reactive element.

24. The method of claim 23, wherein measuring power delivered to the load using the resistive element to obtain the power measurement comprises:
disabling the phase shifter; and
measuring the power delivered to the load using the resistive element with the phase shifter disabled.

25. The method of claim 24, wherein:
the phase shifter includes a switch;
disabling the phase shifter comprises opening the switch; and
enabling the phase shifter comprises closing the switch.

26. The method of claim 20, wherein measuring the voltage comprises:
squaring the voltage to generate a square signal proportional to a square of voltage; and
low-pass filtering the square signal to obtain the voltage measurement.

27. The method of claim 20, wherein the admittance value is proportional to a magnitude of an admittance of the load.

28. The method of claim 20, wherein the impedance value is proportional to a magnitude of an impedance of the load.

29. The method of claim 19, wherein:
the transformer comprises a first inductor and a second inductor, wherein the first inductor is coupled in parallel with the resistive element, and the second inductor is magnetically coupled with the first inductor; and
inducing the phase shift at the transformer comprises inducing the phase shift at the second inductor.

30. The method of claim 29, wherein comprises inducing the phase shift at the second inductor comprising inducing the phase shift at a center tap of the second inductor.

31. A method for measuring a load, comprising:
measuring power delivered to the load to obtain a power measurement, wherein measuring the power delivered to the load to obtain the power measurement comprises:
squaring a voltage from a first terminal of a resistive element to obtain a first square signal, wherein the resistive element is coupled between a power amplifier and the load;
squaring a voltage from a second terminal of the resistive element to obtain a second square signal; and
generating a difference signal based on a difference between the first square signal and the second square signal;
measuring power delivered to the load with a phase shift to obtain a phase-shifted power measurement; and
determining a phase angle of the load based on the power measurement, the phase-shifted power measurement, and the phase shift.

32. The method of claim 31, wherein measuring the power delivered to the load to obtain the power measurement further comprises:
low-pass filtering the first square signal to obtain a filtered first square signal; and
low-pass filtering the second square signal to obtain a filtered second square signal;
wherein generating the difference signal based on the difference between the first square signal and the second square signal comprises generating the difference signal based on a difference between the filtered first square signal and the filtered second square signal.

33. The method of claim 31, wherein measuring the power delivered to the load to obtain the power measurement further comprises low-pass filtering the difference signal.

34. An apparatus for measuring a load, comprising:
means for measuring power delivered to the load using a resistive element to obtain a power measurement, wherein the resistive element is coupled between a power amplifier and the load;
means for measuring power delivered to the load using the resistive element with a phase shift to obtain a phase-shifted power measurement, wherein the means for measuring the power delivered to the load using the resistive element with the phase shift to obtain the phase-shifted power measurement comprises means for inducing the phase shift at a transformer coupled to the resistive element; and
means for determining a phase angle of the load based on the power measurement, the phase-shifted power measurement, and the phase shift.

35. The apparatus of claim 34, further comprising:
means for measuring a voltage on a path coupled to the load to obtain a voltage measurement; and
means for determining an admittance value or an impedance value for the load based on the voltage measurement and the determined phase angle.

* * * * *